United States Patent
Shoda et al.

(10) Patent No.: US 10,320,363 B2
(45) Date of Patent: Jun. 11, 2019

(54) HIGH-FREQUENCY MODULE

(71) Applicant: Murata Manufacturing Co., Ltd., Nagaokakyo-shi, Kyoto-fu (JP)

(72) Inventors: Chihiro Shoda, Nagaokakyo (JP); Takayuki Okude, Nagaokakyo (JP); Kentaro Kawasaki, Nagaokakyo (JP); Kentaro Funahashi, Nagaokakyo (JP); Takayuki Yamada, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 189 days.

(21) Appl. No.: 15/665,452

(22) Filed: Aug. 1, 2017

(65) Prior Publication Data

US 2018/0041188 A1    Feb. 8, 2018

(30) Foreign Application Priority Data

Aug. 5, 2016 (JP) ................................. 2016-155021
Jun. 23, 2017 (JP) ................................. 2017-123547

(51) Int. Cl.
*H03H 9/145* (2006.01)
*H03H 9/64* (2006.01)
(Continued)

(52) U.S. Cl.
CPC ........... *H03H 9/14597* (2013.01); *H03F 1/26* (2013.01); *H03F 1/56* (2013.01); *H03F 3/189* (2013.01);
(Continued)

(58) Field of Classification Search
CPC ... H03F 1/26; H03F 1/56; H03F 3/189; H03F 2200/171; H03F 2200/294;
(Continued)

(56) References Cited

U.S. PATENT DOCUMENTS 5,990,762 A * 11/1999 Nakamura ........... H03H 9/0028
310/313 B
9,887,727 B1 * 2/2018 Yokoyama ........... H04B 1/0057
(Continued)

FOREIGN PATENT DOCUMENTS

JP    10-261937 A    9/1998
JP    2008-301223 A    12/2008
(Continued)

OTHER PUBLICATIONS

Official Communication issued in corresponding Korean Patent Application No. 10-2017-0098120, dated Jun. 21, 2018.

*Primary Examiner* — Patrick O Neill
(74) *Attorney, Agent, or Firm* — Keating & Bennett, LLP

(57) ABSTRACT

A high-frequency module includes a longitudinally coupled surface acoustic wave filter and a low-noise amplifier that is connected to the surface acoustic wave filter. The input impedance of the surface acoustic wave filter connected to the low-noise amplifier differs from the output impedance thereof. On a Smith chart, the output impedance in the pass band of the surface acoustic wave filter is present in a region between a first output impedance and a second output impedance, the first output impedance being the output impedance of the surface acoustic wave filter where a gain of the low-noise amplifier is maximum, the second output impedance being the output impedance of the surface acoustic wave filter where a noise figure of the low-noise amplifier is minimum.

20 Claims, 38 Drawing Sheets

(51) Int. Cl.
*H03F 1/26* (2006.01)
*H03F 3/189* (2006.01)
*H03H 9/02* (2006.01)
*H03F 1/56* (2006.01)

(52) U.S. Cl.
CPC .......... *H03H 9/02992* (2013.01); *H03H 9/64* (2013.01); *H03H 9/6436* (2013.01); *H03H 9/6476* (2013.01); *H03F 2200/171* (2013.01); *H03F 2200/294* (2013.01); *H03F 2200/387* (2013.01); *H03F 2200/451* (2013.01); *H03H 9/02559* (2013.01)

(58) Field of Classification Search
CPC ........ H03F 2200/387; H03F 2200/451; H03H 9/02992; H03H 9/14597; H03H 9/64; H03H 9/6436; H03H 9/6476
See application file for complete search history.

(56) References Cited

U.S. PATENT DOCUMENTS

| | | | |
|---|---|---|---|
| 9,960,898 B2 * | 5/2018 | Uejima | H04B 1/52 |
| 10,218,390 B2 * | 2/2019 | Wloczysiak | H04B 1/0057 |
| 2009/0243703 A1 | 10/2009 | Furutani | |
| 2016/0173061 A1 | 6/2016 | Takamine | |
| 2016/0352494 A1 | 12/2016 | Uejima et al. | |
| 2018/0041192 A1 * | 2/2018 | Shoda | H03H 9/6436 |

FOREIGN PATENT DOCUMENTS

| | | |
|---|---|---|
| KR | 10-2016-0043100 A | 4/2016 |
| WO | 2008/075551 A1 | 6/2008 |
| WO | 2015/125638 A1 | 8/2015 |

\* cited by examiner

— NO WITHDRAWAL ELECTRODES
---- ONE WITHDRAWAL ELECTRODE
—·— TWO WITHDRAWAL ELECTRODES
—··— THREE WITHDRAWAL ELECTRODES

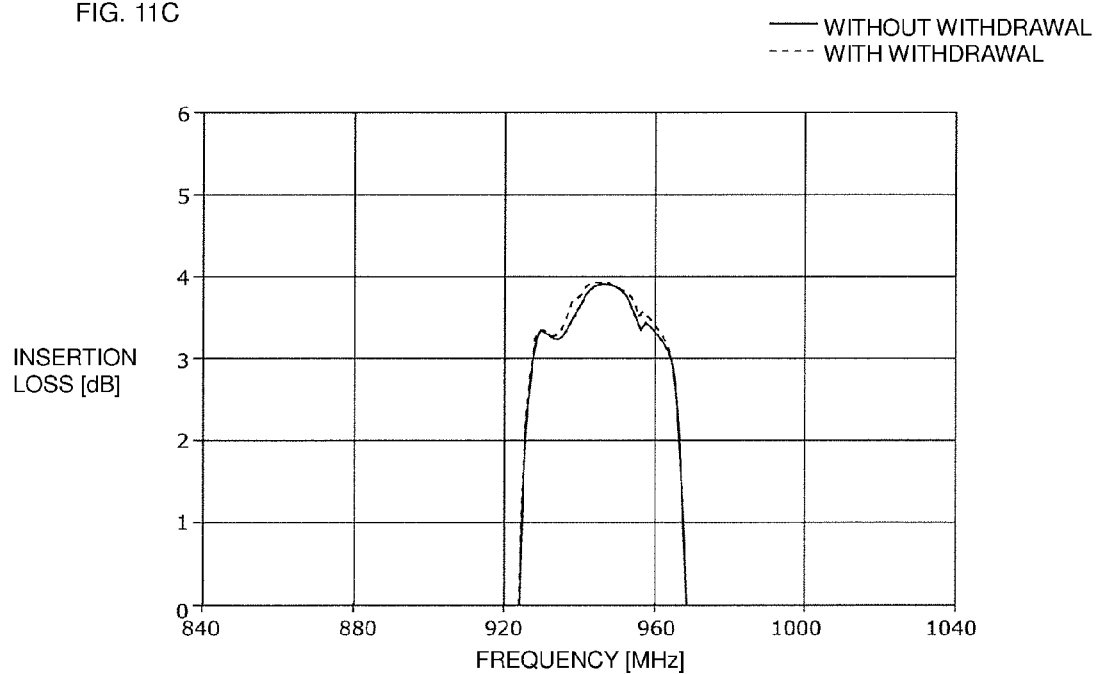

— MAIN WAVE LENGTH RATIO 1.005
—·— MAIN WAVE LENGTH RATIO 1.008
- - - MAIN WAVE LENGTH RATIO 1.012

HIGH-FREQUENCY MODULE

CROSS REFERENCE TO RELATED APPLICATIONS

This application claims the benefit of priority to Japanese Patent Application No. 2017-123547 filed on Jun. 23, 2017 and Japanese Patent Application No. 2016-155021 filed on Aug. 5, 2016. The entire contents of these applications are hereby incorporated herein by reference.

BACKGROUND OF THE INVENTION

1. Field of the Invention

The present invention relates to high-frequency modules.

2. Description of the Related Art

In the related art, a high-frequency module including a surface acoustic wave (SAW) filter has been developed as a circuit module for a mobile communication device. In recent years, as communication frequency bands have been expanded, there has been an increasing demand for a reception circuit module having reduced loss and reduced noise in order to improve the reception sensitivity of a high-frequency module. Thus, the high-frequency module includes other components in the subsequent or preceding stage of the surface acoustic wave filter (see, for example, Japanese Unexamined Patent Application Publication No. 2008-301223).

In a high-frequency module disclosed in Japanese Unexamined Patent Application Publication No. 2008-301223, a low-noise amplifier (LNA) is connected in the subsequent stage of a surface acoustic wave filter. In general, in order to improve noise characteristics of the high-frequency module, the output impedance of the surface acoustic wave filter is adjusted in such a manner that the impedance (output impedance) at an output terminal of the surface acoustic wave filter connected to the low-noise amplifier matches the impedance (input impedance) at an input terminal of the low-noise amplifier.

The output impedance of the surface acoustic wave filter is typically adjusted by changing the intersecting width of interdigital transducer (IDT) electrodes in a resonator included in the surface acoustic wave filter or changing the number of pairs of electrode fingers in the IDT electrodes.

However, in a case where the output impedance of the surface acoustic wave filter is adjusted by changing the intersecting width of IDT electrodes, when the intersecting width is large, the resistance of electrode fingers included in the IDT electrodes is increased, thus increasing a signal loss. In addition, when the intersecting width is small, a diffraction loss occurs in the IDT electrodes, thus increasing a signal loss. Accordingly, in a case of reducing the noise of the surface acoustic wave filter by changing the intersecting width of IDT electrodes, it is difficult to reduce the loss of the high-frequency module.

In addition, in a case where the output impedance of the surface acoustic wave filter is adjusted by changing the number of pairs of electrode fingers in the IDT electrodes, when the number of pairs of electrode fingers is large, a resonant mode spacing that is necessary to form the frequency band of the surface acoustic wave filter becomes narrow, and thus the pass band width of the surface acoustic wave filter becomes narrow. In addition, when the number of pairs of electrode fingers is small, the resonant mode spacing becomes wide, and thus the characteristics of voltage standing wave ratio (VSWR) are degraded, and the signal loss is increased. Thus, also in a case of reducing the noise of the surface acoustic wave filter by changing the number of pairs of electrode fingers in the IDT electrodes, it is difficult to reduce the loss of the high-frequency module.

SUMMARY OF THE INVENTION

Preferred embodiments of the present invention provide high-frequency modules that reduce both loss and noise.

A high-frequency module according to a preferred embodiment of the present invention includes a longitudinally coupled surface acoustic wave filter including a plurality of resonators; and a low-noise amplifier that is connected to the surface acoustic wave filter and that amplifies a high-frequency signal that has passed through the surface acoustic wave filter. An input impedance of the surface acoustic wave filter connected to the low-noise amplifier differs from an output impedance thereof. On a Smith chart, the output impedance in a pass band of the surface acoustic wave filter is present in a region between a first output impedance and a second output impedance, the first output impedance being the output impedance of the surface acoustic wave filter where a gain of the low-noise amplifier becomes the maximum, the second output impedance being the output impedance of the surface acoustic wave filter where a noise figure of the low-noise amplifier becomes the minimum.

Thus, on the Smith chart, the output impedance of the surface acoustic wave filter is adjusted between the output impedance of the surface acoustic wave filter where the gain of the low-noise amplifier becomes the maximum and the output impedance of the surface acoustic wave filter where the noise figure of the low-noise amplifier becomes the minimum, and thus it is possible to reduce both the loss and noise of the surface acoustic wave filter and the high-frequency module.

The surface acoustic wave filter may have an electrode parameter to adjust the output impedance in the pass band of the surface acoustic wave filter to be in the region on the Smith chart.

Thus, by adjusting the electrode parameter in the surface acoustic wave filter, it is possible to reduce both the loss and noise.

An interdigital transducer (IDT) electrode of at least one of the resonators that is connected to an output terminal of the surface acoustic wave filter may include a withdrawal electrode, and the electrode parameter may be the number of the withdrawal electrodes.

Thus, by adjusting the number of withdrawal electrodes, it is possible to adjust the capacitive impedance of the resonator in which the withdrawal electrode is provided. Accordingly, it is possible to adjust the output impedance of the surface acoustic wave filter.

The withdrawal electrode may be provided in a center portion of the resonator.

Thus, by providing the withdrawal electrode in the center position of the resonator where influence on the resonant mode is small, it is possible to reduce the loss of the surface acoustic wave filter.

The withdrawal electrode may be provided in an approximately central region to occupy an approximately 46% area portion of the resonator.

Thus, by providing the withdrawal electrode in a predetermined region of the center position of the resonator where influence on the resonant mode is small, it is possible to further reduce the loss of the surface acoustic wave filter.

The IDT electrode of one of the resonators that is connected to the output terminal of the surface acoustic wave filter may be divided in an intersecting width direction, and the electrode parameter may be a number of divisions of the IDT electrode in the intersecting width direction.

Thus, it is possible to adjust the output impedance of the surface acoustic wave filter without being influenced by a diffraction loss of the resonator in which the IDT electrodes are divided.

The electrode parameter may include a first main wave length and a second main wave length, the first main wave length being an average main wave length of one or more of the resonators that are connected to an input terminal of the surface acoustic wave filter, the second main wave length being an average main wave length of one of the resonators that is connected to the output terminal of the surface acoustic wave filter, and the first main wave length may differ from the second main wave length.

Thus, it is possible to change the output impedance of the surface acoustic wave filter from about 50Ω, for example. Accordingly, by changing the output impedance of the surface acoustic wave filter, impedance matching is able to be achieved between the surface acoustic wave filter and the low-noise amplifier.

The electrode parameter may be a main wave length ratio that is a ratio of the second main wave length to the first main wave length, and the main wave length ratio may be higher than or equal to about 1.01, for example.

Thus, it is possible to set the output impedance of the surface acoustic wave filter to be higher than about 50Ω, for example. Accordingly, impedance matching is able to be achieved with higher accuracy between the surface acoustic wave filter and the low-noise amplifier.

The electrode parameter may be a main duty of one of the resonators that is connected to the output terminal of the surface acoustic wave filter, and the main duty may be higher than about 0.55 and lower than about 0.75, for example.

Thus, by increasing and decreasing the main duty of the resonator connected to the output terminal of the surface acoustic wave filter, it is possible to increase and decrease the output impedance of the surface acoustic wave filter. In addition, since the output impedance of the surface acoustic wave filter is able to be changed from about 50Ω, by changing the output impedance of the surface acoustic wave filter, impedance matching is achieved between the surface acoustic wave filter and the low-noise amplifier.

In the surface acoustic wave filter, a wiring between the IDT electrode of one of the resonators that is connected to the output terminal of the surface acoustic wave filter and the output terminal of the surface acoustic wave filter may be provided on an interlayer insulating film located on a substrate.

Thus, by reducing the capacitive coupling between the wiring and the substrate, it is possible to adjust the output impedance of the surface acoustic wave filter farther toward an inductive impedance side.

Each IDT electrode in the surface acoustic wave filter may include a first electrode layer and a second electrode layer, the first electrode layer being provided on the substrate, the second electrode layer being provided on the first electrode layer, and the wiring at a position where the interlayer insulating film is disposed may include the first electrode layer and the second electrode layer.

Thus, since the decrease in the capacitive coupling between the wiring and the substrate is small, it is possible to adjust the output impedance of the surface acoustic wave filter toward the inductive impedance side with a small adjustment amount.

The wiring at a position where the interlayer insulating film is disposed may include the second electrode layer being provided on the interlayer insulating film.

Thus, since the capacitive coupling between the wiring and the substrate is able to be further reduced, it is possible to adjust the output impedance of the surface acoustic wave filter farther toward the inductive impedance side.

According to preferred embodiments of the present invention, high-frequency modules that reduce both loss and noise are provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3A is a plan view, and FIG. 3B is a sectional view taken along a dotted chain line illustrated in FIG. 3A.

FIG. 11C illustrates bandpass characteristics of the high-frequency module according to the first preferred embodiment of the present invention in which the output impedance of the surface acoustic wave filter is adjusted.

DETAILED DESCRIPTION OF THE PREFERRED EMBODIMENTS

Figure 1:
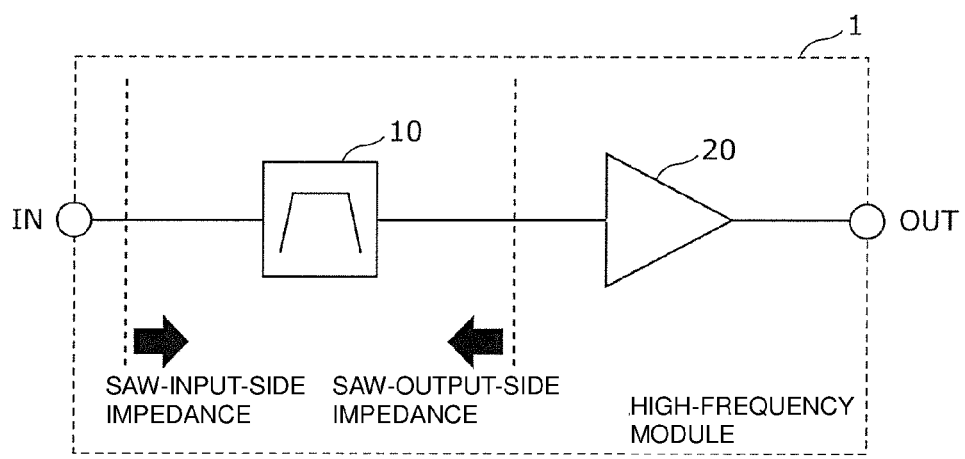
FIG. 1 is a conceptual diagram illustrating the configuration of a high-frequency module according to a first preferred embodiment of the present invention.

Now, preferred embodiments of the present invention will be described below. Note that the preferred embodiments described below each illustrate preferred specific examples of the present invention. Therefore, the numerical values, shapes, materials, components, positions for arrangements and ways of connection of the components, and the like described in the following preferred embodiments are examples and are not to limit the present invention. Accordingly, among the components in the following preferred embodiments, components that are not described in an independent claim illustrating the most superordinate concepts of preferred embodiments of the present invention will be described as optional components.

In addition, each of the drawings is a schematic drawing and is not an exact illustration. In the drawings, components that are substantially the same are denoted by the same reference numerals, and repeated description thereof will be omitted or described briefly. In addition, in the illustrated electrode configurations, the number of electrode fingers in resonators and reflectors is smaller than the actual number of electrode fingers for ease of understanding of preferred embodiments of the present invention. In the illustrated Smith charts, portions of output impedance in pass bands of surface acoustic wave filters are illustrated by bold lines.

First Preferred Embodiment

Now, a first preferred embodiment of the present invention will be described below with reference to FIGS. 1 to 11C.

First, the configuration of a high-frequency module 1 according to this preferred embodiment will be described. FIG. 1 is a conceptual diagram illustrating the configuration of the high-frequency module 1 according to this preferred embodiment.

As illustrated in FIG. 1, the high-frequency module 1 according to this preferred embodiment includes a surface acoustic wave filter 10 and a low-noise amplifier 20. One terminal of the surface acoustic wave filter 10 is connected to an input terminal IN of the high-frequency module 1, and the other terminal of the surface acoustic wave filter 10 is connected to the low-noise amplifier 20. The low-noise amplifier 20 is an amplifier that amplifies, without increasing noise as much as possible, weak radio waves that have been received.

Note that the input impedance of the surface acoustic wave filter 10 refers to the impedance of the surface acoustic wave filter 10 from the input terminal IN of the high-frequency module 1 toward the surface acoustic wave filter 10. That is, the input impedance is an SAW-input-side impedance illustrated by an arrow in FIG. 1. In addition, the output impedance of the surface acoustic wave filter 10 refers to the impedance of the surface acoustic wave filter 10 from a terminal (not illustrated) of the surface acoustic wave filter 10 connected to the low-noise amplifier 20 toward the surface acoustic wave filter 10. That is, the output impedance is an SAW-output-side impedance illustrated by another arrow in FIG. 1. The input impedance of the surface acoustic wave filter 10 connected to the low-noise amplifier 20 differs from the output impedance thereof.

Figure 2A:
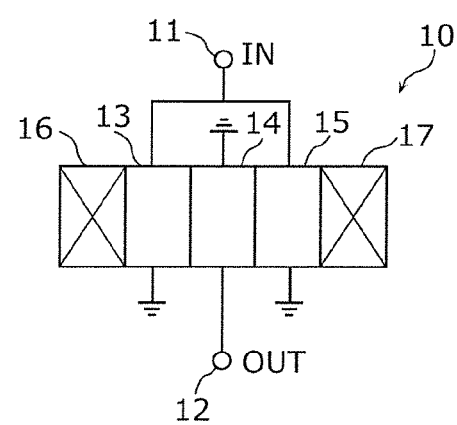
FIG. 2A schematically illustrates the configuration of a surface acoustic wave filter according to the first preferred embodiment of the present invention.
Figure 2B:
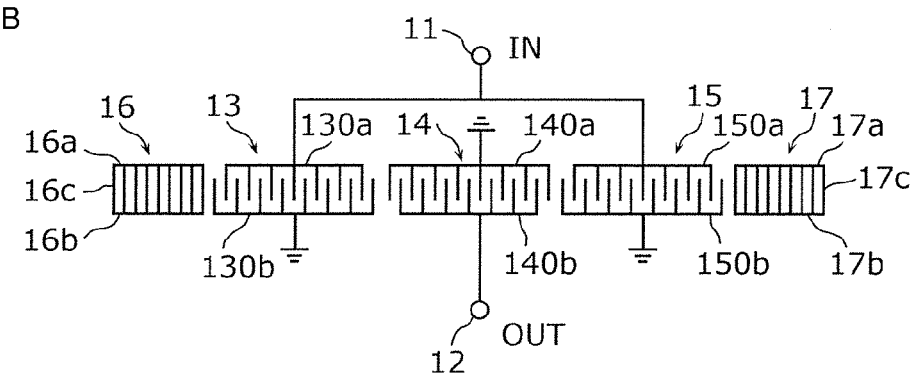
FIG. 2B schematically illustrates a basic configuration of the surface acoustic wave filter illustrated in FIG. 2A.

FIG. 2A schematically illustrates the configuration of the surface acoustic wave filter 10 according to this preferred embodiment. FIG. 2B schematically illustrates a basic configuration of the surface acoustic wave filter 10 illustrated in FIG. 2A.

The surface acoustic wave filter 10 is a longitudinally coupled surface acoustic wave filter. As illustrated in FIG. 2A, the surface acoustic wave filter 10 includes, between an input terminal 11 and an output terminal 12, a resonator 13, a resonator 14, a resonator 15, a reflector 16, and a reflector 17. The resonator 13, the resonator 14, and the resonator 15 are disposed in this order from the reflector 16 side to the reflector 17 side.

As illustrated in FIG. 2B, the resonator 13 has a configuration in which two IDT electrodes 130a and 130b are combined. The IDT electrode 130a of the resonator 13 is connected to the input terminal 11, and the IDT electrode 130b is connected to the ground. Similarly, the resonator 15 has a configuration in which two IDT electrodes 150a and 150b are combined. The IDT electrode 150a of the resonator 15 is connected to the input terminal 11, and the IDT electrode 150b is connected to the ground.

In addition, the resonator 14 disposed between the resonator 13 and the resonator 15 has a configuration in which two IDT electrodes 140a and 140b are combined. The IDT electrode 140a of the resonator 14 is connected to the ground, and the IDT electrode 140b is connected to the output terminal 12. Note that the configuration of the resonator 14 will be described later in detail.

In addition, the reflector 16 includes two busbar electrodes 16a and 16b and a plurality of electrode fingers 16c provided between the busbar electrode 16a and the busbar electrode 16b. One end of each of the electrode fingers 16c is connected to the busbar electrode 16a, and the other end thereof is connected to the busbar electrode 16b. Similarly, the reflector 17 includes two busbar electrodes 17a and 17b and a plurality of electrode fingers 17c provided between the busbar electrode 17a and the busbar electrode 17b. One end of each of the electrode fingers 17c is connected to the busbar electrode 17a, and the other end thereof is connected to the busbar electrode 17b.

Figure 3A:
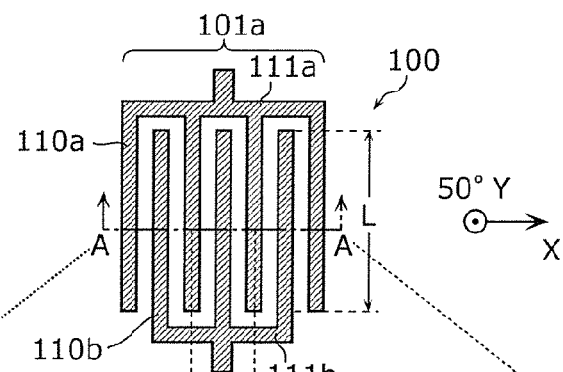
FIGS. 3A and 3B schematically illustrate the configuration of a typical surface acoustic wave filter.
Figure 3B:
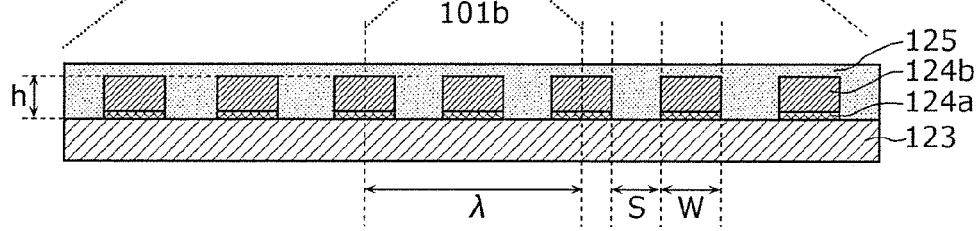

Here, the configuration of each resonator will be described in more detail referring to a typical resonator 100. FIGS. 3A and 3B schematically illustrate the configuration of a typical surface acoustic wave filter, FIG. 3A is a plan view, and FIG. 3B is a sectional view taken along a doted chain line illustrated in FIG. 3A.

As illustrated in FIGS. 3A and 3B, the resonator 100 includes a piezoelectric substrate 123, a comb-shaped IDT electrode 101a, and a comb-shaped IDT electrode 101b.

The piezoelectric substrate 123 preferably is made of, for example, a LiNbO$_3$ single crystal that is cut at a predetermined cut-angle. On the piezoelectric substrate 123, the surface acoustic wave propagates in a predetermined direction.

As illustrated in FIG. 3A, a pair of IDT electrodes 101a and 101b that face each other are provided on the piezoelectric substrate 123. The IDT electrode 101a includes a plurality of electrode fingers 110a that are parallel or substantially parallel to one another and a busbar electrode 111a that connects the plurality of electrode fingers 110a to one another. The IDT electrode 101b includes a plurality of electrode fingers 110b that are parallel or substantially parallel to one another and a busbar electrode 111b that connects the plurality of electrode fingers 110b to one another. The IDT electrodes 101a and 101b have a configuration such that the plurality of electrode fingers 110b of the IDT electrode 101b are each disposed between the plurality of electrode fingers 110a of the IDT electrode 101a.

In addition, as illustrated in FIG. 3B, the IDT electrodes 101a and 101b each have a configuration in which a close-contact layer 124a and a main electrode layer 124b are laminated.

The close-contact layer 124a is a layer to increase the adhesiveness between the piezoelectric substrate 123 and the main electrode layer 124b and is preferably made of, for example, NiCr.

The main electrode layer 124b is preferably made of, for example, Pt. The main electrode layer 124b may include a single layer or multiple layers.

A protective layer 125 covers the IDT electrodes 101a and 101b. The protective layer 125 is a layer that protects the main electrode layer 124b from an external environment, that adjusts frequency-temperature characteristics, that increases moisture resistance, and the like. The protective layer 125 is a film including, for example, silicon dioxide (SiO$_2$) as a main component. The protective layer 125 may include a single layer or multiple layers.

Note that the materials of the close-contact layer 124a, the main electrode layer 124b, and the protective layer 125 are not limited to the above-described materials. In addition, the IDT electrodes 101a and 101b do not have to have the above-described laminate configuration. The IDT electrodes 101a and 101b may be formed of a metal such as Ti, Al, Cu, Pt, Au, Ag, or Pd or an alloy thereof or may be formed of a laminate configuration including a plurality of layers made of any of the above metals and alloys. Furthermore, the protective layer 125 is not necessarily provided.

Here, design parameters of the IDT electrodes 101a and 101b will be described. λ illustrated in FIG. 3B is a pitch of the electrode fingers 110a and the electrode fingers 110b included in the IDT electrodes 101a and 101b. A main wave length of the surface acoustic wave filter is defined by the pitch λ of the plurality of electrode fingers 110a and 110b included in the IDT electrodes 101a and 101b. Note that the main wave length refers to the wave length in a main pitch region of each of the IDT electrodes 101a and 101b, which will be described later.

The pitch λ specifically refers to, in two electrode fingers that are adjacent to each other and connected to the same busbar electrode, the length from the center of the width of one electrode finger to the center of the width of the other electrode finger. For example, in FIG. 3B, the pitch λ is the length from the center of the width of one of the electrode fingers 110*a* connected to the busbar electrode 111*a* to the center of the width of another one of the electrode fingers 110*a* that is adjacent to the one of the electrode fingers 110*a* and that is connected to the same busbar electrode 111*a*, to which the one of the electrode fingers 110*a* is also connected.

In addition, W illustrated in FIG. 3B refers to the width of each of the electrode fingers 110*a* of the IDT electrode 101*a* and each of the electrode fingers 110*b* of the IDT electrode 101*b* in the resonator 100. Furthermore, S illustrated in FIG. 3B refers to a spacing between the electrode fingers 110*a* and the electrode fingers 110*b*. Furthermore, L illustrated in FIG. 3A refers to an intersecting width of the IDT electrodes 101*a* and 101*b* and is the length of a portion in which the electrode fingers 110*a* of the IDT electrode 101*a* overlap with the electrode fingers 110*b* of the IDT electrode 101*b*. Furthermore, the number of pairs refers to the number of the electrode fingers 110*a* or the electrode fingers 110*b*.

A duty of the IDT electrodes 101*a* and 101*b* refers to a ratio of a width of the electrode fingers 110*a* and 110*b* to the repetitive pitch $\lambda$ of the electrode fingers 110*a* and 110*b*. More specifically, the duty of the IDT electrodes 101*a* and 101*b* is "W/(W+S)" where W is the width of each of the electrode fingers 110*a* and 110*b* of the IDT electrodes 101*a* and 101*b* and where S is the spacing between the electrode fingers 110*a* and the electrode fingers 110*b* as illustrated in FIG. 3B. In addition, a main duty refers to the duty in the main pitch region of each of the IDT electrodes 101*a* and 101*b*, which will be described later.

In addition, a center portion of the resonator 100 refers to a predetermined area from the center of the IDT electrodes 101*a* and 101*b* of the resonator 100 in the propagation direction of the surface acoustic wave. The predetermined area is, for example, an approximately 46% area of the entire resonator 100 in an approximately central portion, as will be described later. The predetermined area may be changed as appropriate.

Note that the configuration of the resonator 100 is not limited to the configuration illustrated in FIGS. 3A and 3B. In addition, the configuration of the surface acoustic wave filter 10 according to this preferred embodiment is not limited to the above-described configuration.

Now, the configuration of the resonator 14 will be described in more detail.

Figure 4:
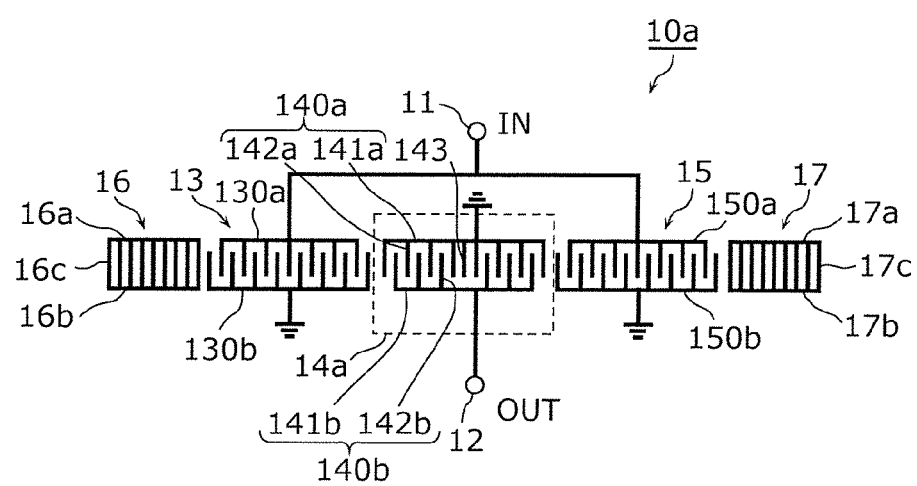
FIG. 4 schematically illustrates a detailed configuration of the surface acoustic wave filter according to the first preferred embodiment of the present invention.
Figures 5A, 5B:
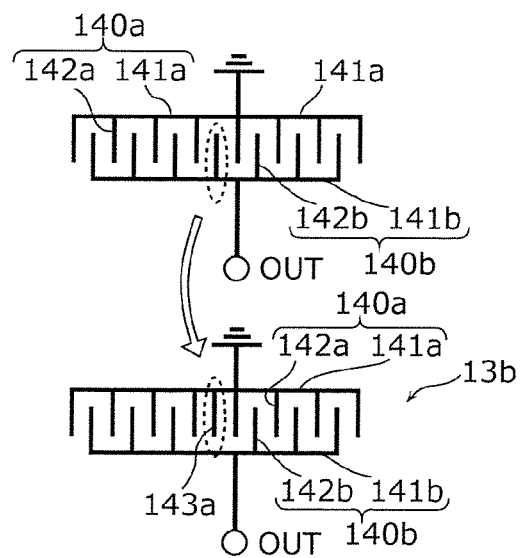
FIGS. 5A and 5B schematically illustrate the configuration of a resonator including one withdrawal electrode in the surface acoustic wave filter according to the first preferred embodiment of the present invention.
Figure 6A:
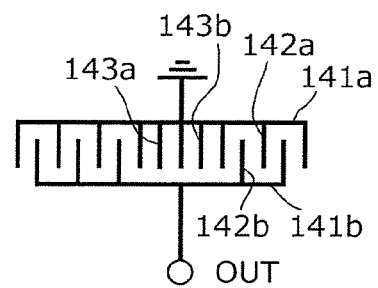
FIG. 6A schematically illustrates the configuration of the resonator including two withdrawal electrodes in the surface acoustic wave filter according to the first preferred embodiment of the present invention.
Figure 6B:
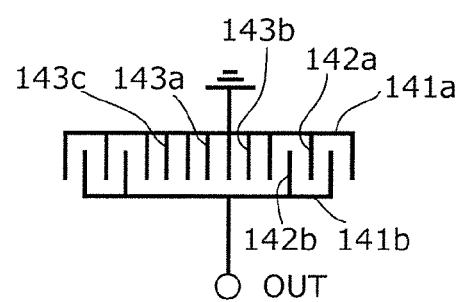
FIG. 6B schematically illustrates the configuration of the resonator including three withdrawal electrodes in the surface acoustic wave filter according to the first preferred embodiment of the present invention.

FIG. 4 schematically illustrates a detailed configuration of a surface acoustic wave filter 10*a* according to this preferred embodiment. FIGS. 5A and 5B schematically illustrate the configuration of a resonator 14*a* including one withdrawal electrode in the surface acoustic wave filter 10*a* according to this preferred embodiment. FIG. 6A schematically illustrates the configuration of the resonator 14*a* including two withdrawal electrodes. FIG. 6B schematically illustrates the configuration of the resonator 14*a* including three withdrawal electrodes.

As illustrated in FIG. 4, the resonator 14*a* has a configuration in which the two IDT electrodes 140*a* and 140*b* are combined. The IDT electrode 140*a* includes a busbar electrode 141*a* and a plurality of electrode fingers 142*a* each including an end connected to the busbar electrode 141*a*. Similarly, the IDT electrode 140*b* includes a busbar electrode 141*b* and a plurality of electrode fingers 142*b* each including an end connected to the busbar electrode 141*b*. The electrode fingers 142*a* and 142*b* are arranged with a pitch that is narrower at and in the vicinity of both sides of the resonator 14*a* than the pitch at the center portion, which is other than both sides and the vicinity thereof. Note that the regions where the pitch of the electrode fingers is narrow are referred to as narrow-pitch regions, and the other regions are referred to as main pitch regions. The number of pairs of the electrode fingers 142*a* and 142*b* in the narrow-pitch regions is, for example, three.

In addition, the resonator 14*a* includes a withdrawal electrode 143 provided in the IDT electrode 140*a* connected to the ground. The withdrawal electrode 143 is obtained as follows: as illustrated in FIG. 5A, in the IDT electrode 140*b* to be connected to the output terminal 12, at least one of the plurality of electrode fingers 142*b* to be connected to the busbar electrode 141*b* is withdrawn, and as illustrated in FIG. 5B, the one of the electrode fingers is connected to, instead of the busbar electrode 141*b*, the busbar electrode 141*a* in the IDT electrode 140*a* connected to the ground.

In a case of providing one withdrawal electrode 143, as illustrated in FIG. 5B, a withdrawal electrode 143*a* is provided between two of the electrode fingers 142*a* connected to the busbar electrode 141*a* in the IDT electrode 140*a*. Thus, between the two of the electrode fingers 142*b* included in the IDT electrode 140*b*, three electrode fingers that are connected to the busbar electrode 141*a* are continuously arranged side by side.

Note that the number of the withdrawal electrodes 143 is not limited to one and may be two or more. Furthermore, two or more continuous electrode fingers among the electrode fingers 142*b* connected to the busbar electrode 141*b* may be provided as the withdrawal electrodes 143, or two or more discontinuous electrode fingers among the electrode fingers 142*b* connected to the busbar electrode 141*b* may be provided as the withdrawal electrodes 143.

For example, in a case of providing two continuous withdrawal electrodes 143*a* and 143*b*, as illustrated in FIG. 6A, between two of the electrode fingers 142*b* included in the IDT electrode 140*b*, five electrodes, which are three of the electrode fingers 142*a* connected to the busbar electrode 141*a* and the withdrawal electrodes 143*a* and 143*b*, are continuously arranged side by side. In addition, in a case of providing three continuous withdrawal electrodes 143*a*, 143*b*, and 143*c*, as illustrated in FIG. 6B, between two of the electrode fingers 142*b* included in the IDT electrode 140*b*, seven electrodes, which are four of the electrode fingers 142*a* connected to the busbar electrode 141*a* and the withdrawal electrodes 143*a*, 143*b*, and 143*c*, are continuously arranged side by side. As will be described later, by changing the number of the withdrawal electrodes 143, the surface acoustic wave filter 10*a* is able to be matched to the noise figure and gain of the low-noise amplifier 20. That is, the number of the withdrawal electrodes defines and functions as an electrode parameter to match the surface acoustic wave filter 10*a* to the noise figure and gain of the low-noise amplifier 20.

Note that the withdrawal electrode 143 may be connected to the busbar electrode 141*a* connected to the ground as described above, or may be connected to the busbar electrode 141*b* connected to the output terminal 12.

Figure 7:
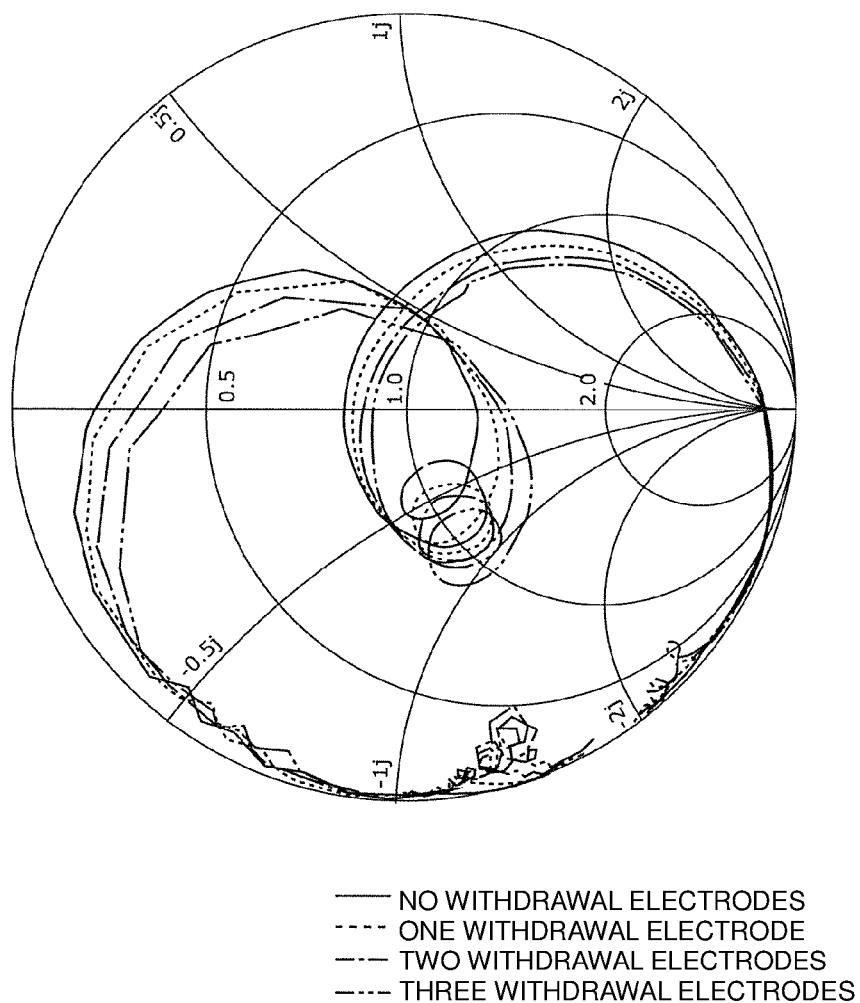
FIG. 7 illustrates reflection characteristics of the output terminal side of the surface acoustic wave filter according to the first preferred embodiment of the present invention.

FIG. 7 illustrates reflection characteristics of the output terminal side of the surface acoustic wave filter 10*a* according to this preferred embodiment. In FIG. 7, a solid line, a dashed line, a dotted chain line, and a two-dot chain line respectively indicate reflection characteristics of the output terminal side of the surface acoustic wave filter 10*a* including zero, one, two, and three continuous withdrawal electrodes 143.

If the number of the withdrawal electrodes 143 is incremented by one from zero to three, as illustrated in FIG. 7, the output impedance shifts toward a capacitive impedance side on a Smith chart. Accordingly, it is discovered that the withdrawal electrode 143 is useful when it is desired that the output impedance of the surface acoustic wave filter 10a shift toward the capacitive impedance side. In addition, by increasing the number of the withdrawal electrodes 143 to be continuously provided, the output impedance is shifted further toward the capacitive impedance side.

Figure 8:
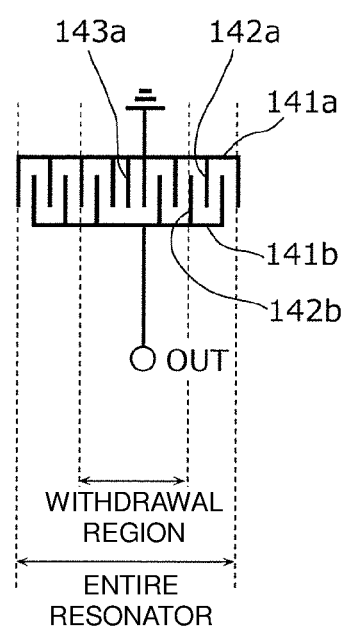
FIG. 8 schematically illustrates the configuration of the resonator in order to describe the position of the withdrawal electrode to be provided in the surface acoustic wave filter according to the first preferred embodiment of the present invention.
Figure 9:
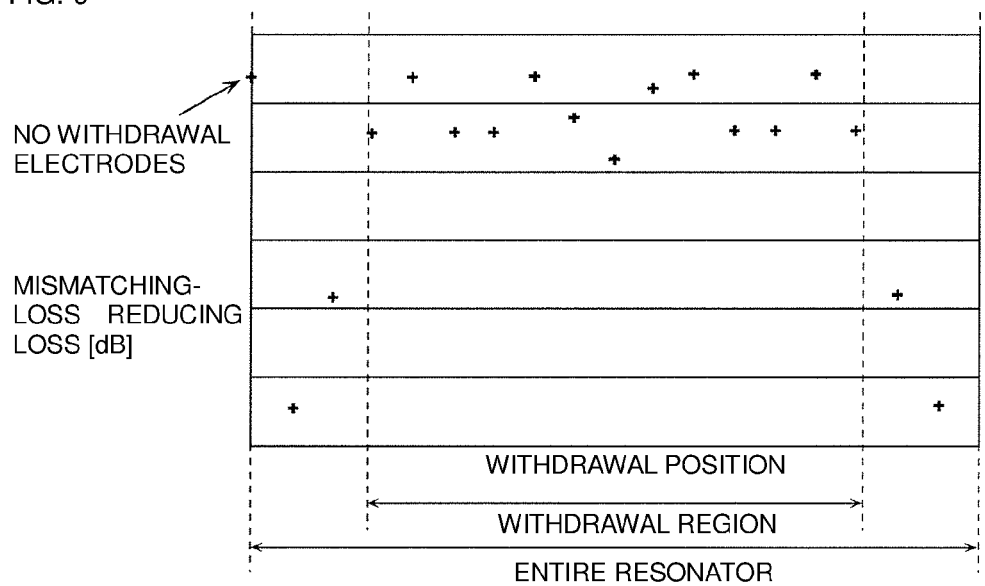
FIG. 9 illustrates the relationship between the position of the withdrawal electrode to be provided in the surface acoustic wave filter according to the first preferred embodiment of the present invention and a signal loss of the output terminal side of the surface acoustic wave filter.

Here, the position of the withdrawal electrode 143 to be provided in the resonator 14a will be described. FIG. 8 schematically illustrates the configuration of the resonator 14a in order to describe the position of the withdrawal electrode 143 to be provided in the surface acoustic wave filter 10a according to this preferred embodiment. FIG. 9 illustrates the relationship between the position of the withdrawal electrode 143 to be provided in the surface acoustic wave filter 10a according to this preferred embodiment and a signal loss at the output terminal side of the surface acoustic wave filter 10a. Here, the longitudinal axis shows the amount of a signal loss; larger downward and smaller upward in the FIG. 9.

As illustrated in FIG. 8, the withdrawal electrode 143 is provided in the center portion of the entire resonator 14a. Note that the region in which the withdrawal electrode 143 is provided is referred to as a withdrawal region.

As described above, narrow-pitch regions are provided at and in the vicinity of both sides of the resonator 14a in the propagation direction of the surface acoustic wave. Here, if the position of the withdrawal electrode 143 to be provided in the resonator 14a is changed, a change of arrangements of the electrode fingers 142a and 142b in the narrow-pitch regions is assumed to influence a resonant mode in a certain manner.

For example, as illustrated in FIG. 9, it is discovered that, if the withdrawal electrode 143 is provided in a predetermined area at both sides of the resonator 14a in order to match the impedance of the output terminal side of the surface acoustic wave filter 10a, the signal loss (mismatching loss) due to the mismatching of the impedance of the output terminal side of the surface acoustic wave filter 10a is increased, and that the impedance of the output terminal side is mismatched. On the other hand, it is discovered that, if the withdrawal electrode 143 is provided in the center portion of the resonator 14a, the mismatching loss decreases to about 5 dB, for example, and that the impedance of the output terminal side is matched. Note that if no withdrawal electrode 143 is provided, the mismatching loss is about 5.5 dB, for example, and it is discovered that the mismatching loss is not increased if the withdrawal electrode 143 is provided in the center portion of the resonator 14, that is, if the withdrawal region is set in the center portion of the resonator 14, as in a case where no withdrawal electrode 143 is provided. More specifically, the withdrawal region to reduce the mismatching loss in FIG. 9 is an approximately 46% area of the entire resonator 14a in an approximately central region.

From the above description, the withdrawal electrode 143 is preferably provided in the center portion of the resonator 14a. For example, the withdrawal electrode 143 may be provided in the approximately 46% area of the resonator 14a in the approximately central portion.

Next, adjustment of the output impedance of the surface acoustic wave filter 10a to which the low-noise amplifier 20 is connected as illustrated in FIG. 1 will be described.

Figure 10:
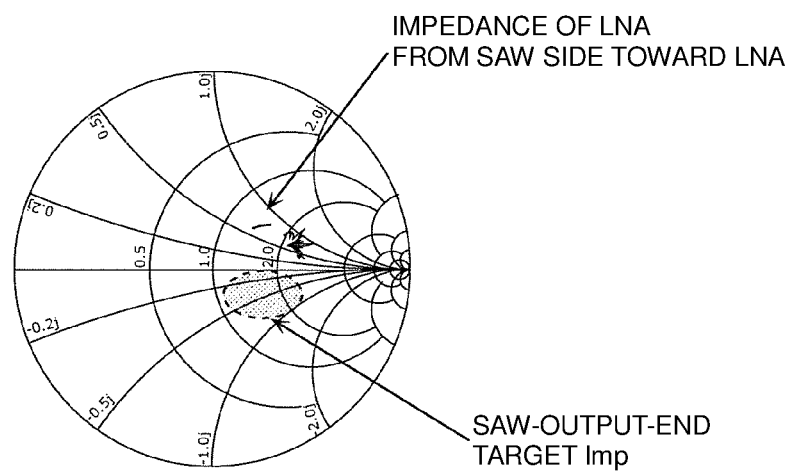
FIG. 10 illustrates a method to adjust an output impedance of the surface acoustic wave filter according to the first preferred embodiment of the present invention.

FIG. 10 illustrates a method to adjust the output impedance of the surface acoustic wave filter 10a according to this preferred embodiment.

As illustrated in FIG. 1, since the surface acoustic wave filter 10a is connected to the low-noise amplifier 20 and used as the high-frequency module 1, it is necessary to adjust the output impedance so as to improve transmission characteristics of the entire high-frequency module 1. That is, the output impedance of the surface acoustic wave filter 10a is adjusted in accordance with the input impedance of the low-noise amplifier 20.

Specifically, the output impedance of the surface acoustic wave filter 10a is adjusted so as to be located on a Smith chart at the position of the complex conjugate of the input impedance of the low-noise amplifier 20 from the surface acoustic wave filter 10a side toward the low-noise amplifier 20. Here, the input impedance of the low-noise amplifier 20 is an input impedance that achieves both an increase in characteristics of the gain and the noise figure of the low-noise amplifier 20. That is, the input impedance of the low-noise amplifier 20 is an input impedance located on a Smith chart in a region between the input impedance of the low-noise amplifier 20 where the gain of the low-noise amplifier 20 becomes the maximum and the input impedance of the low-noise amplifier 20 where the noise figure of the low-noise amplifier 20 becomes the minimum. The output impedance of the surface acoustic wave filter 10a is adjusted to be in a region (region of target impedance (Imp) at the SAW output end (SAW-output-end target-Imp region) illustrated in FIG. 10) of the complex conjugate corresponding to the above region.

That is, as illustrated in FIG. 10, the output impedance of the surface acoustic wave filter 10a is adjusted in such a manner that the output impedance in the pass band of the surface acoustic wave filter 10a is present on a Smith chart in a region (SAW-output-end target-Imp region) between the output impedance (first output impedance) of the surface acoustic wave filter 10a where the gain of the low-noise amplifier 20 becomes the maximum and the output impedance (second output impedance) of the surface acoustic wave filter 10a where the noise figure of the low-noise amplifier 20 becomes the minimum.

At this time, by providing the above-described withdrawal electrode 143, the output impedance of the surface acoustic wave filter 10a is adjusted. In addition, by increasing or decreasing the number of the withdrawal electrodes 143, the output impedance of the surface acoustic wave filter 10a is adjusted. That is, the number of the withdrawal electrodes 143 defines and functions as an electrode parameter to adjust the output impedance of the surface acoustic wave filter 10a to be in the SAW-output-end target-Imp region. In addition, in order to adjust the output impedance of the surface acoustic wave filter 10a, one of the electrode fingers 142b in the IDT electrode 140b on the output terminal 12 side of the surface acoustic wave filter 10a is preferably connected to the busbar electrode 141a to define and function as the withdrawal electrode 143. Thus, since electrode fingers of the same polarity are arranged side by side only in a region of the resonator 14a, the capacitance of the resonator 14a becomes lower than in a case where no withdrawal electrode 143 is provided. This changes the impedance of the output terminal side of the surface acoustic wave filter 10a to which the resonator 14a including the withdrawal electrode 143 is connected. In addition, as illustrated in FIG. 7, the impedance of the output terminal side of the surface acoustic wave filter 10a shifts toward the capacitive impedance side by including the withdrawal electrode 143, and accordingly, the impedance of the output terminal side of the surface acoustic wave filter 10a is easily adjusted to be in the SAW-output-end target-Imp region on a Smith chart.

Figure 11A:
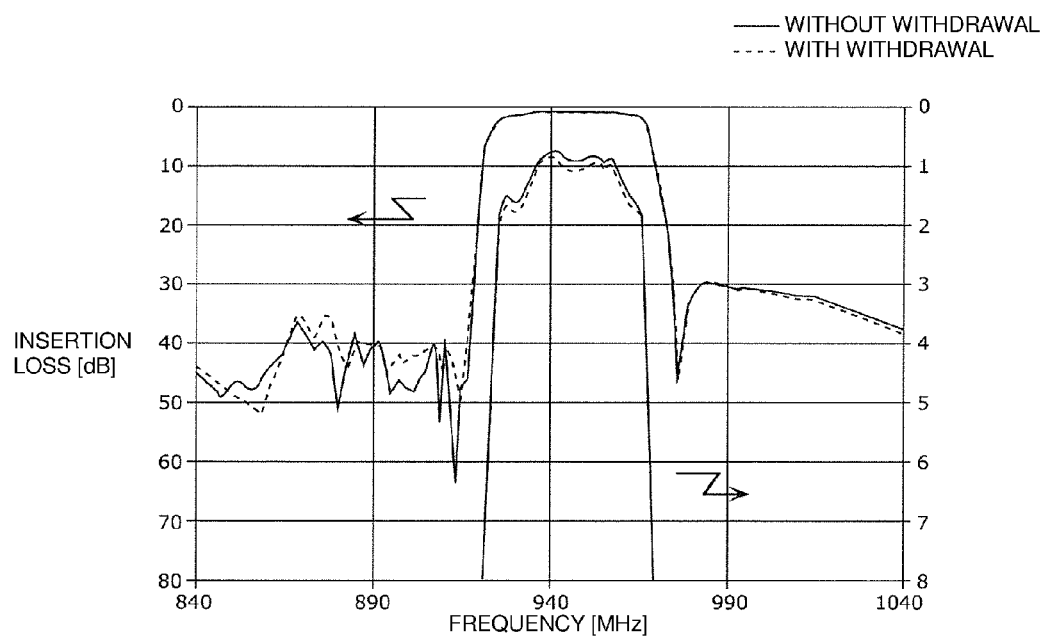
FIG. 11A illustrates bandpass characteristics of the surface acoustic wave filter according to the first preferred embodiment of the present invention in which the output impedance of the surface acoustic wave filter is adjusted.
Figure 11B:
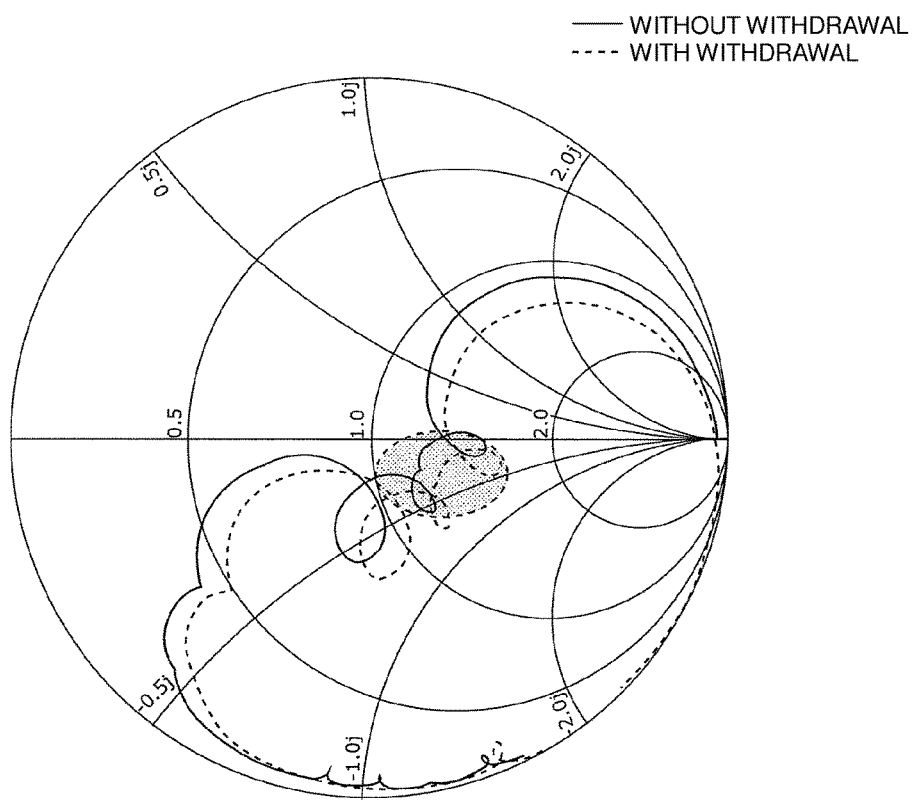
FIG. 11B illustrates reflection characteristics of the output terminal side of the surface acoustic wave filter according to the first preferred embodiment of the present invention in which the output impedance of the surface acoustic wave filter is adjusted.

FIG. 11A illustrates bandpass characteristics of the surface acoustic wave filter 10a according to this preferred embodiment in which the output impedance of the surface acoustic wave filter 10a is adjusted. FIG. 11B illustrates reflection characteristics of the output terminal side of the surface acoustic wave filter 10a according to this preferred embodiment in which the output impedance of the surface acoustic wave filter 10a is adjusted. FIG. 11C illustrates bandpass characteristics of the high-frequency module 1 in which the output impedance of the surface acoustic wave filter 10a according to this preferred embodiment is adjusted. In FIGS. 11A to 11C, solid lines indicate characteristics obtained if no withdrawal electrode 143 is provided, and dashed lines indicate characteristics obtained if the withdrawal electrode 143 is provided.

As illustrated in FIG. 11A, if the output impedance of the surface acoustic wave filter 10a is adjusted, the insertion loss of the surface acoustic wave filter 10a alone is larger than that obtained if the output impedance of the surface acoustic wave filter 10a is not adjusted. In this case, the output impedance in the pass band of the surface acoustic wave filter 10a is adjusted to be in the above-described SAW-output-end target-Imp region as illustrated in FIG. 11B.

On the other hand, as illustrated in FIG. 11C, it is discovered that the insertion loss is reduced in the pass band as for the bandpass characteristics of the entire high-frequency module 1 including the low-noise amplifier 20 besides the surface acoustic wave filter 10a. Accordingly, by providing the withdrawal electrode 143 in the resonator 14a on the output terminal side in the surface acoustic wave filter 10a, and by adjusting the output impedance of the surface acoustic wave filter 10a to be in the above-described SAW-output-end target-Imp region on a Smith chart, transmission characteristics of the entire high-frequency module 1 including the low-noise amplifier 20 besides the surface acoustic wave filter 10a are improved.

As described above, according to the high-frequency module 1 according to this preferred embodiment, by providing the withdrawal electrode 143 in the resonator 14a on the output terminal side in the surface acoustic wave filter 10a, and by adjusting the output impedance of the surface acoustic wave filter 10a to be in the above-described SAW-output-end target-Imp region on a Smith chart, transmission characteristics of the entire high-frequency module 1 including the low-noise amplifier 20 besides the surface acoustic wave filter 10a are improved.

In addition, in this case, by increasing the number of the withdrawal electrodes 143 to be continuously provided, the output impedance of the surface acoustic wave filter 10a is shifted further toward the capacitive impedance side.

Second Preferred Embodiment

Next, a second preferred embodiment of the present invention will be described with reference to FIGS. 12A to 14B. A high-frequency module according to this preferred embodiment is different from the high-frequency module 1 according to the first preferred embodiment in that each of the IDT electrodes in the resonator 14 on the output terminal side is divided into two in the intersecting width direction as a method to adjust the output impedance of the surface acoustic wave filter 10.

Figure 12A:
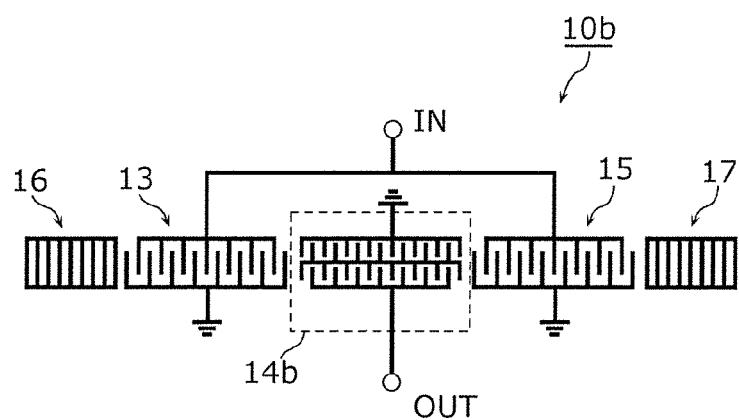
FIG. 12A schematically illustrates the configuration of a surface acoustic wave filter according to a second preferred embodiment of the present invention.
Figure 12B:
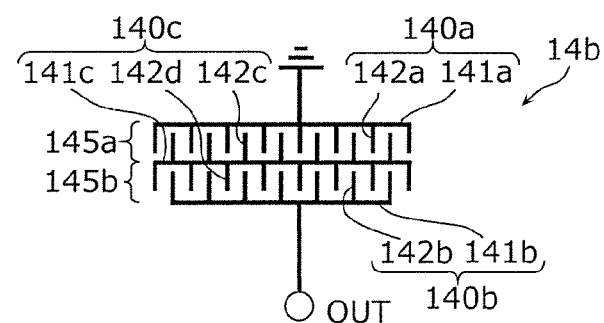
FIG. 12B schematically illustrates the configuration of a resonator in the surface acoustic wave filter according to the second preferred embodiment of the present invention.

First, the configuration of a surface acoustic wave filter 10b according to this preferred embodiment will be described. FIG. 12A schematically illustrates the configuration of the surface acoustic wave filter 10b according to this preferred embodiment. FIG. 12B schematically illustrates the configuration of the resonator 14 in the surface acoustic wave filter 10b according to this preferred embodiment.

As illustrated in FIG. 12A, the surface acoustic wave filter 10b includes the resonator 13, a resonator 14b, and the resonator 15. The resonator 13 and the resonator 15 have the same or substantially the same configurations as the resonator 13 and the resonator 15 described in the first preferred embodiment, and therefore description thereof is omitted.

As illustrated in FIG. 12A, the resonator 14b includes IDT electrodes each of which is divided into two in the intersecting width direction. That is, as illustrated in FIG. 12B, the resonator 14b includes a first IDT electrode 145a and a second IDT electrode 145b that are connected in series to each other in the intersecting width direction. That is, in the surface acoustic wave filter 10b, the number of divisions of IDT electrodes preferably is two, for example.

Specifically, as illustrated in FIG. 12B, the resonator 14b has a configuration in which the IDT electrode 140a, the IDT electrode 140b, and an IDT electrode 140c are combined. As in the IDT electrode 140a described in the first preferred embodiment, the IDT electrode 140a includes the busbar electrode 141a and the plurality of electrode fingers 142a each including an end connected to the busbar electrode 141a. Similarly, the IDT electrode 140b includes the busbar electrode 141b and the plurality of electrode fingers 142b each including an end connected to the busbar electrode 141b. The IDT electrode 140c includes a busbar electrode 141c, a plurality of electrode fingers 142c each of which includes an end connected to the busbar electrode 141c and is provided from the busbar electrode 141c toward the busbar electrode 141a, and a plurality of electrode fingers 142d each of which includes an end connected to the busbar electrode 141c and is provided from the busbar electrode 141c toward the busbar electrode 141b. The electrode fingers 142a and the electrode fingers 142c are alternately disposed in the propagation direction of the surface acoustic wave. Similarly, the electrode fingers 142b and the electrode fingers 142d are alternately disposed in the propagation direction of the surface acoustic wave.

Thus, the first IDT electrode 145a includes the IDT electrode 140a and the busbar electrode 141c and the electrode fingers 142c of the IDT electrode 140c. In addition, the second IDT electrode 145b includes the IDT electrode 140b and the busbar electrode 141c and the electrode fingers 142d of the IDT electrode 140c. The busbar electrode 141c is shared by the first IDT electrode 145a and the second IDT electrode 145b.

In the resonator 14b, the distance between the busbar electrode 141a and the busbar electrode 141b is equal to the distance between the busbar electrode 141a and the busbar electrode 141b in the resonator 14 in which the IDT electrodes are not divided in the intersecting width direction. That is, in the resonator 14b, the length of each of the first IDT electrode 145a and the second IDT electrode 145b in the intersecting width direction is shorter than the length of each of the IDT electrodes in the intersecting width direction that are not divided in the intersecting width direction. For example, the length of each of the first IDT electrode 145a and the second IDT electrode 145b in the intersecting width direction is about ½ of the length of each of the IDT electrodes in the intersecting width direction that are not divided in the intersecting width direction.

With this configuration, the output impedance of the surface acoustic wave filter 10b is increased, as will be described later.

Here, transmission characteristics of the surface acoustic wave filter 10b and the high-frequency module 1 obtained if the output impedance of the surface acoustic wave filter 10b is adjusted by using the above-described resonator 14b will be described.

Figure 13:
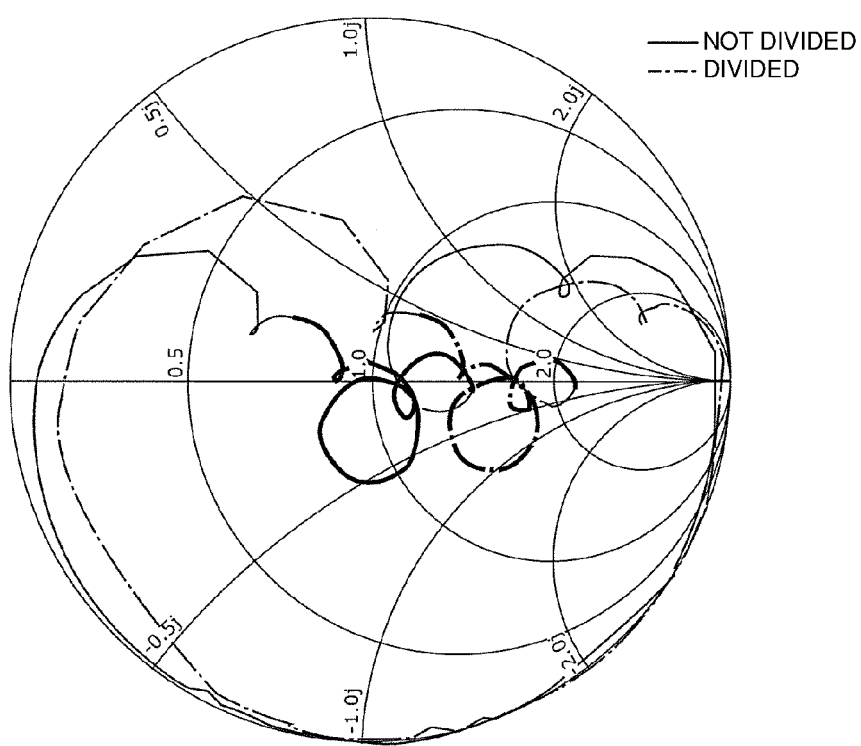
FIG. 13 illustrates reflection characteristics of the output terminal side of the surface acoustic wave filter according to the second preferred embodiment of the present invention.
Figure 14A:
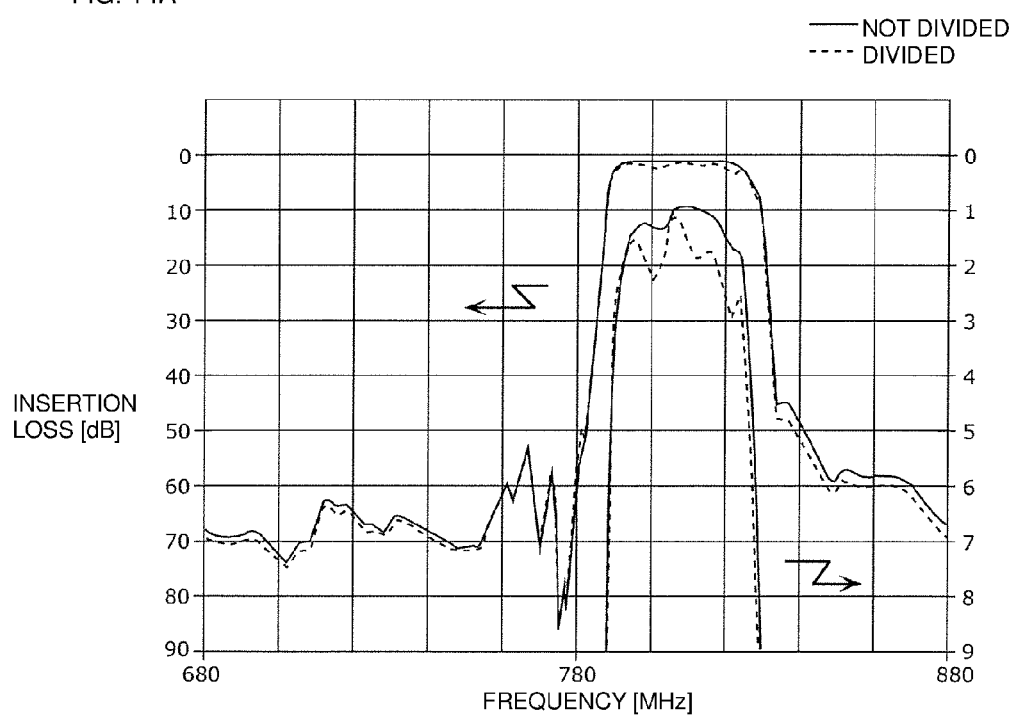
FIG. 14A illustrates bandpass characteristics of the output terminal side of the surface acoustic wave filter according to the second preferred embodiment of the present invention.
Figure 14B:
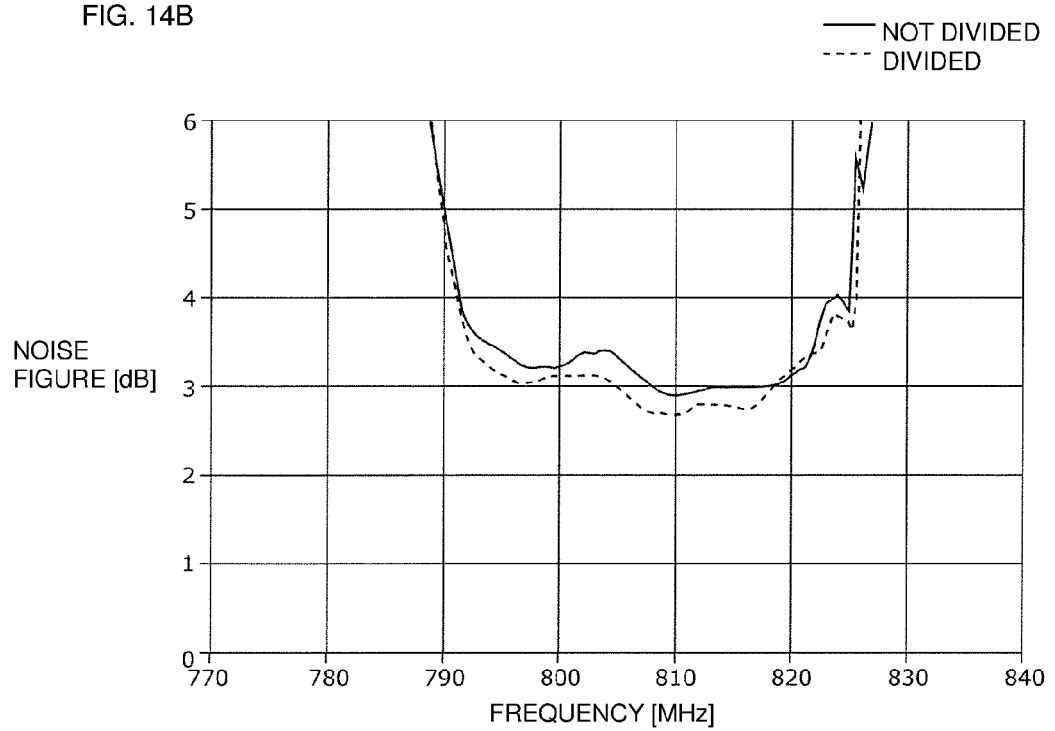
FIG. 14B illustrates noise characteristics of the output terminal side of the high-frequency module having the surface acoustic wave filter according to the second preferred embodiment of the present invention.

FIG. 13 illustrates reflection characteristics of the output terminal side of the surface acoustic wave filter 10b according to this preferred embodiment. FIG. 14A illustrates bandpass characteristics of the output terminal side of the surface acoustic wave filter 10b according to this preferred embodiment. FIG. 14B illustrates noise characteristics of the output terminal side of the high-frequency module 1 having the surface acoustic wave filter 10b according to this preferred embodiment. In FIG. 13, solid lines indicate characteristics of the surface acoustic wave filter 10 including the resonator 14 in which the IDT electrodes are not divided in the intersecting width direction, and dashed-dotted lines indicate characteristics of the surface acoustic wave filter 10b including the resonator 14b in which the IDT electrodes are divided in the intersecting width direction. In FIGS. 14A and 14B, solid lines indicate characteristics of the surface acoustic wave filter 10 including the resonator 14 in which the IDT electrodes are not divided in the intersecting width direction, and dashed lines indicate characteristics of the surface acoustic wave filter 10b including the resonator 14b in which the IDT electrodes are divided in the intersecting width direction.

As described above, on a Smith chart, the output impedance of the surface acoustic wave filter 10b including the resonator 14b in which the IDT electrodes are divided in the intersecting width direction shifts with respect to the output impedance of the surface acoustic wave filter 10 including the resonator 14 in which the IDT electrodes are not divided in the intersecting width direction in such a manner that the output impedance in the pass band is increased as illustrated in FIG. 13.

This is because each of the IDT electrodes is divided into two, and thus the first IDT electrode 145a and the second IDT electrode 145b, each of which has about ½ of the length in the intersecting width direction, are connected in series to each other in the intersecting width direction, resulting in obtaining an impedance about four times as high. Accordingly, as illustrated in FIG. 13, the output impedance of the surface acoustic wave filter 10b is increased.

In addition, as illustrated in FIG. 14A, if the output impedance of the surface acoustic wave filter 10b is adjusted, the insertion loss of the surface acoustic wave filter 10b alone is larger than that obtained if the output impedance of the surface acoustic wave filter 10b is not adjusted. In this case, the output impedance in the pass band of the surface acoustic wave filter 10b is adjusted to be in the SAW-output-end target-Imp region illustrated in FIG. 11B in the first preferred embodiment.

On the other hand, as for the entire high-frequency module 1 including the low-noise amplifier 20 besides the surface acoustic wave filter 10b, as illustrated in FIG. 14B, it is discovered that when using the surface acoustic wave filter 10b including the resonator in which the IDT electrodes are divided in two, instead of the resonator in which IDT electrodes are not divided, the noise figure is reduced in the pass band of the high-frequency module 1. It is considered that, by configuring the surface acoustic wave filter 10b by using the resonator 14b in which the IDT electrodes are divided, the output impedance of the surface acoustic wave filter 10b approaches a noise-figure (NF) circle of the low-noise amplifier 20 on a Smith chart, and thus the noise characteristics of the entire high-frequency module 1 are improved.

Accordingly, by dividing the IDT electrodes in the resonator 14b on the output terminal side in the surface acoustic wave filter 10b, and by adjusting the output impedance of the surface acoustic wave filter 10b to be in the SAW-output-end target-Imp region on a Smith chart, transmission characteristics of the entire high-frequency module 1 including the low-noise amplifier 20 besides the surface acoustic wave filter 10b are improved.

Note that although only the resonator 14b in which each of the IDT electrodes in the resonator 14 is divided into two has been described above, the number of divisions of the IDT electrodes in the resonator 14b is not limited to two and may be three or more in the surface acoustic wave filter 10b, for example.

In addition, in order to adjust the output impedance of the surface acoustic wave filter 10b, although the above-described surface acoustic wave filter 10b has a configuration in which the IDT electrodes in the resonator 14b connected to the output terminal of the surface acoustic wave filter 10b are divided, in a case of adjusting the input impedance of the surface acoustic wave filter 10b, IDT electrodes in a resonator connected to the input terminal of the surface acoustic wave filter 10 may be divided.

Third Preferred Embodiment

Next, a third preferred embodiment of the present invention will be described with reference to FIGS. 15 to 18B. A high-frequency module according to this preferred embodiment is different from the high-frequency module 1 according to the first preferred embodiment in that a main wave length of a resonator connected to an input-terminal side of a surface acoustic wave filter 10c and a main wave length of a resonator connected to an output terminal side of the surface acoustic wave filter 10c are adjusted as a method to adjust the output impedance of the surface acoustic wave filter 10c.

First, as an example of the configuration of a surface acoustic wave filter according to this preferred embodiment, the surface acoustic wave filter 10c, which is a longitudinally coupled surface acoustic wave filter including three resonators, will be described.

Figure 15:
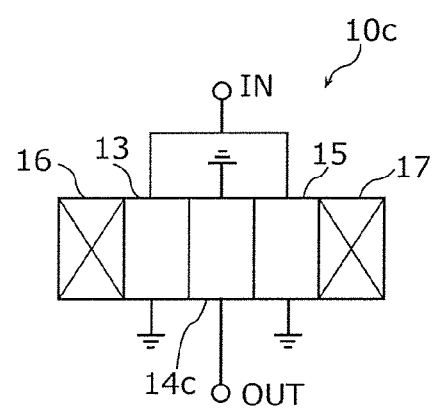
FIG. 15 schematically illustrates the configuration of a surface acoustic wave filter according to a third preferred embodiment of the present invention.

FIG. 15 schematically illustrates the configuration of the surface acoustic wave filter 10c according to this preferred embodiment. As illustrated in FIG. 15, the surface acoustic wave filter 10c is a longitudinally coupled surface acoustic wave filter. The surface acoustic wave filter 10c includes, between the input terminal 11 and the output terminal 12, the resonator 13, a resonator 14c, the resonator 15, the reflector 16, and the reflector 17. The resonator 13, the resonator 14c, and the resonator 15 are disposed in this order from the reflector 16 side to the reflector 17 side.

In addition, the resonator 13 and the resonator 15 are connected to the input terminal 11 of the surface acoustic wave filter 10c. The resonator 14c is connected to the output terminal 12 of the surface acoustic wave filter 10c. The input impedance at the input terminal 11 of the surface acoustic wave filter 10c and the output impedance at the output terminal 12 thereof are each about 50Ω, for example.

The resonator 13 and the resonator 15 have the same or substantially the same configurations as those in the surface acoustic wave filter 10 described in the first preferred embodiment. In addition, the reflector 16 and the reflector 17 have the same or substantially the same configurations as those in the surface acoustic wave filter 10 described in the first preferred embodiment.

The resonator 14c has a configuration in which the two IDT electrodes 140a and 140b are combined, as in the resonator 14 described in the first preferred embodiment. The IDT electrode 140a includes the busbar electrode 141a and the plurality of electrode fingers 142a each including an end connected to the busbar electrode 141a. Similarly, the IDT electrode 140b includes the busbar electrode 141b and the plurality of electrode fingers 142b each including an end connected to the busbar electrode 141b.

The average value of main wave lengths of the resonator 13 and the resonator 15 connected to the input terminal 11 of the surface acoustic wave filter 10c is different from the average value of a main wave length of the resonator 14c connected to the output terminal 12 of the surface acoustic wave filter 10c. Note that the average value of the main wave length of the resonator 14c connected to the output terminal 12 is the main wave length of the resonator 14c itself because only one resonator is connected to the output terminal 12. The main wave length of the resonator 13 may be the same as or different from the main wave length of the resonator 15.

For example, the main wavelengths of the resonator 13 and the resonator 15 may be about 4.515 μm and about 4.525 μm, respectively, and the average value of these main wave lengths may be about 4.520 μm. In addition, the main wave length of the resonator 14c may be about 4.542 μm. In this case, a ratio (main wave length ratio) of the average value of the main wave length of the resonator 14c connected to the output terminal 12 of the surface acoustic wave filter 10c to the average value of the main wave lengths of the resonator 13 and the resonator 15 connected to the input terminal 11 of the surface acoustic wave filter 10c is about 1.005, for example.

Note that the average value of the main wave lengths of the resonator 13 and the resonator 15 connected to the input terminal 11 of the surface acoustic wave filter 10c corresponds to a first main wave length. In addition, the average value of the main wave length of the resonator 14c connected to the output terminal 12 of the surface acoustic wave filter 10c corresponds to a second main wave length.

Thus, by changing the ratio (main wave length ratio) of the average value (second main wave length) of the main wave length of the resonator 14c connected to the output terminal 12 of the surface acoustic wave filter 10c to the average value (first main wave length) of the main wave lengths of the resonator 13 and the resonator 15 connected to the input terminal 11 of the surface acoustic wave filter 10c, the output impedance of the surface acoustic wave filter 10c is able to be adjusted, as will be described below.

Figure 16A:
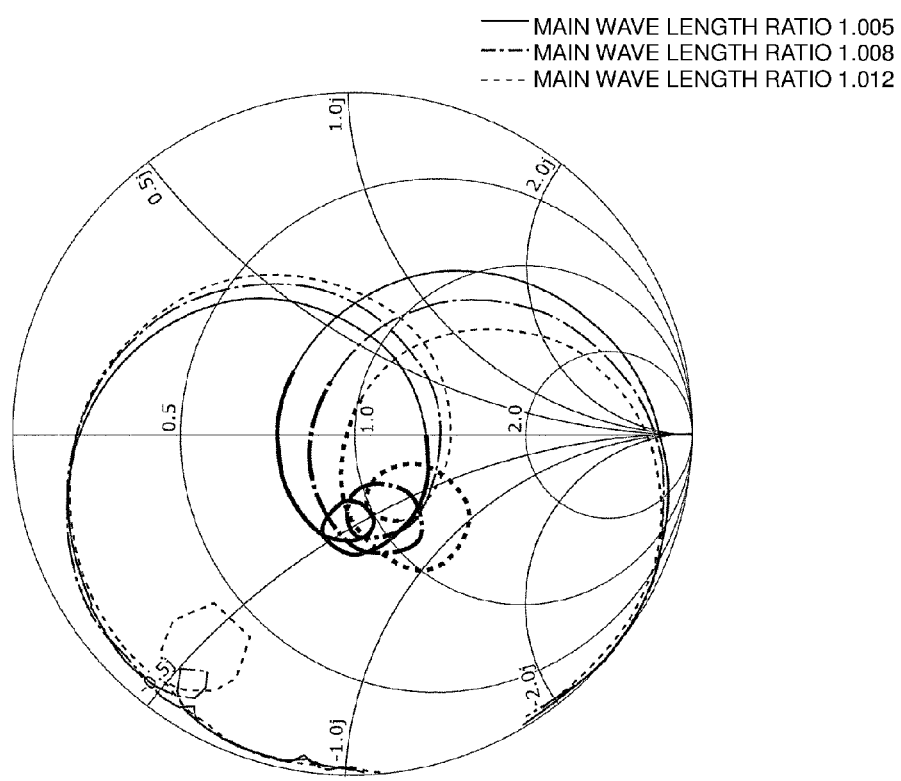
FIG. 16A illustrates reflection characteristics of the output terminal side of the surface acoustic wave filter according to the third preferred embodiment of the present invention.
Figure 16B:
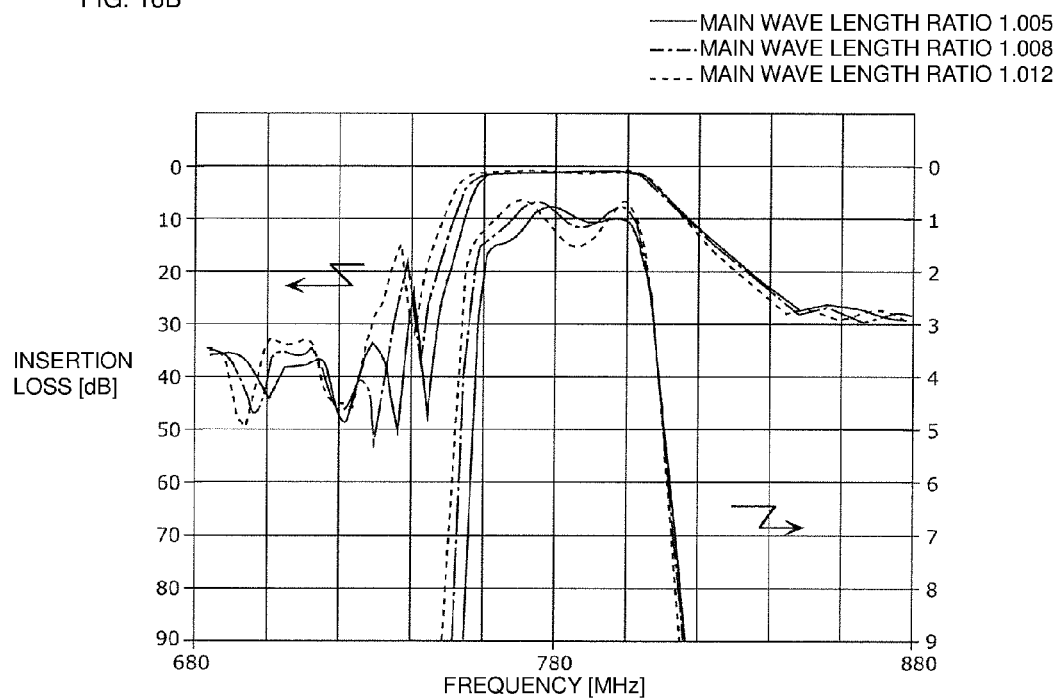
FIG. 16B illustrates bandpass characteristics of the output terminal side of the surface acoustic wave filter according to the third preferred embodiment of the present invention.

Now, transmission characteristics of the surface acoustic wave filter 10c obtained if the output impedance of the surface acoustic wave filter 10c is adjusted by changing the main wave length ratio as described above will be described below. Referring to FIGS. 16A and 16B, transmission characteristics of the surface acoustic wave filter 10c obtained if the main wave length ratio of the surface acoustic wave filter 10c is set at about 1.005, about 1.008, and about 1.012, for example, will be described.

FIG. 16A illustrates reflection characteristics of the output terminal side of the surface acoustic wave filter 10c according to this preferred embodiment. FIG. 16B illustrates bandpass characteristics of the output terminal side of the surface acoustic wave filter 10c according to this preferred embodiment. In FIGS. 16A and 16B, solid lines, dotted chain lines, and dashed lines respectively indicate characteristics of the surface acoustic wave filter 10c in which the main wave length ratio is set at about 1.005, about 1.008, and about 1.012, for example.

If the main wave length ratio is set at about 1.005, about 1.008, and about 1.012, for example, the output impedance in the pass band of the surface acoustic wave filter 10c shifts right on a Smith chart as the main wave length ratio is increased, as illustrated in FIG. 16A. That is, it is discovered that the output impedance of the surface acoustic wave filter 10c is increased as the main wave length ratio is increased.

Accordingly, by increasing the main wave length ratio among the resonator 13, the resonator 14c, and the resonator 15 in the surface acoustic wave filter 10c, the output impedance of the surface acoustic wave filter 10c can be higher than about 50Ω, for example.

Note that in a case of providing the low-noise amplifier 20 in the subsequent stage of the surface acoustic wave filter 10c as in the high-frequency module 1 illustrated in FIG. 1, the output impedance of the surface acoustic wave filter 10c is preferably about 70Ω, for example. In order to increase the output impedance of the surface acoustic wave filter 10c to about 70Ω, the main wave length ratio is preferably set at about 1.01 or higher, for example.

In addition, as illustrated in FIG. 16B, if the main wave length ratio is set at about 1.005, about 1.008, and about 1.012, for example the pass band width of the surface acoustic wave filter 10c is expanded. That is, it is discovered that the pass band of the surface acoustic wave filter 10c is expanded as the main wave length ratio is increased.

Figure 17:
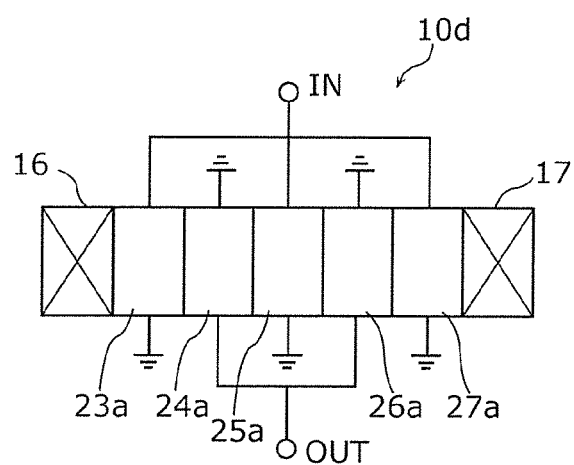
FIG. 17 schematically illustrates another configuration of the surface acoustic wave filter according to the third preferred embodiment of the present invention.

FIG. 17 schematically illustrates the configuration of a longitudinally coupled surface acoustic wave filter 10d including five resonators as another configuration of the surface acoustic wave filter according to this preferred embodiment.

As illustrated in FIG. 17, the surface acoustic wave filter 10d includes, between the input terminal 11 and the output terminal 12, a resonator 23a, a resonator 24a, a resonator 25a, a resonator 26a, a resonator 27a, the reflector 16, and the reflector 17. The resonator 23a, the resonator 24a, the resonator 25a, the resonator 26a, and the resonator 27a are disposed in this order from the reflector 16 side to the reflector 17 side.

The resonator 23a, the resonator 25a, and the resonator 27a are connected to the input terminal 11 of the surface acoustic wave filter 10d. The resonator 24a and the resonator 26a are connected to the output terminal 12 of the surface acoustic wave filter 10d. The input impedance at the input terminal 11 of the surface acoustic wave filter 10d and the output impedance at the output terminal 12 thereof are each about 50Ω, for example.

The resonator 23a, the resonator 25a, and the resonator 27a each have the same or substantially the same configuration as the resonator 13 in the surface acoustic wave filter 10c described above. In addition, the resonator 24a and the resonator 26a each have the same or substantially the same configuration as the resonator 14 in the surface acoustic wave filter 10c described above.

The average value of main wave lengths of the resonator 23a, the resonator 25a, and the resonator 27a connected to the input terminal 11 of the surface acoustic wave filter 10d is different from the average value of a main wave lengths of the resonator 24a and the resonator 26a connected to the output terminal 12 of the surface acoustic wave filter 10d. The main wave lengths of the resonator 23a, the resonator 25a, and the resonator 27a may be the same as or different from one another, and the main wave lengths of the resonator 24*a* and the resonator 26*a* may be the same as or different from each other.

Note that the average value of the main wave lengths of the resonator 23*a*, the resonator 25*a*, and the resonator 27*a* connected to the input terminal 11 of the surface acoustic wave filter 10*d* corresponds to the first main wave length. In addition, the average value of the main wave lengths of the resonator 24*a* and the resonator 26*a* connected to the output terminal 12 of the surface acoustic wave filter 10*d* corresponds to the second main wave length.

By changing the ratio (main wave length ratio) of the average value (second main wave length) of the main wave lengths of the resonator 24*a* and the resonator 26*a* connected to the output terminal 12 of the surface acoustic wave filter 10*d* to the average value (first main wave length) of the main wave lengths of the resonator 23*a*, the resonator 25*a*, and the resonator 27*a* connected to the input terminal 11 of the surface acoustic wave filter 10*d*, the output impedance of the surface acoustic wave filter 10*d* are able to be adjusted, as will be described below.

Figure 18A:
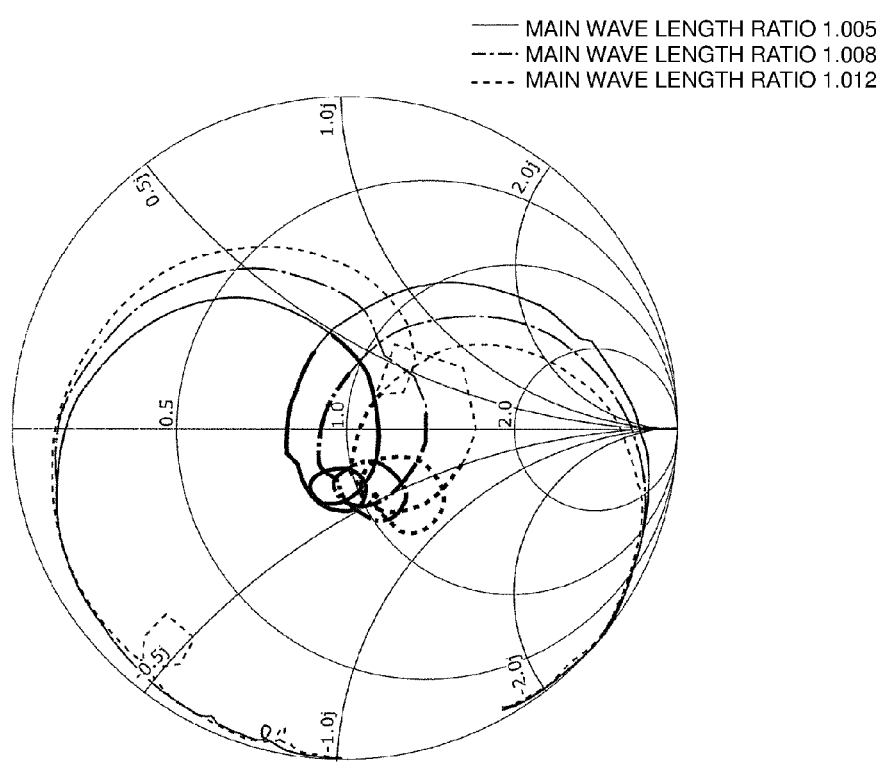
FIG. 18A illustrates reflection characteristics of the output terminal side of the surface acoustic wave filter according to the third preferred embodiment of the present invention having another configuration.
Figure 18B:
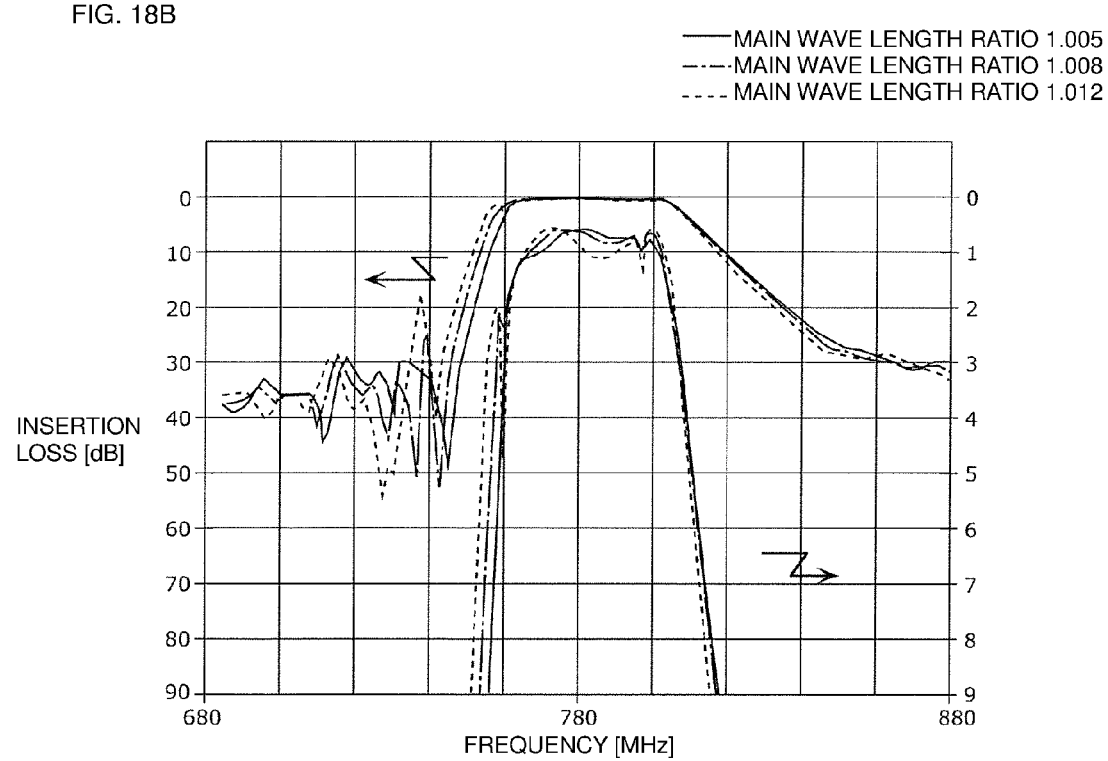
FIG. 18B illustrates bandpass characteristics of the output terminal side of the surface acoustic wave filter according to the third preferred embodiment of the present invention having another configuration.

Now, transmission characteristics of the surface acoustic wave filter 10*d* obtained if the output impedance of the surface acoustic wave filter 10*d* is adjusted by changing the main wave length ratio as described above will be described below. Referring to FIGS. 18A and 18B, transmission characteristics of the surface acoustic wave filter 10*d* obtained if the main wave length ratio of the surface acoustic wave filter 10*d* is set at about 1.005, about 1.008, and about 1.012, for example, will be described.

FIG. 18A illustrates reflection characteristics of the output terminal side of the surface acoustic wave filter 10*d* according to this preferred embodiment. FIG. 18B illustrates bandpass characteristics of the output terminal side of the surface acoustic wave filter 10*d* according to this preferred embodiment. In FIGS. 18A and 18B, solid lines, dotted chain lines, and dashed lines respectively indicate characteristics of the surface acoustic wave filter 10*d* in which the main wave length ratio is set at about 1.005, about 1.008, and about 1.012, for example.

As in a case of the above-described surface acoustic wave filter 10*c*, if the main wave length ratio is set at about 1.005, about 1.008, and about 1.012, for example, the output impedance in the pass band of the surface acoustic wave filter 10*d* shifts right on a Smith chart as the main wave length ratio is increased, as illustrated in FIG. 18A. That is, it is discovered that the output impedance of the surface acoustic wave filter 10*d* is increased as the main wave length ratio is increased.

Accordingly, by increasing the main wave length ratio among the resonator 23*a*, the resonator 24*a*, the resonator 25*a*, the resonator 26*a*, and the resonator 27*a* in the surface acoustic wave filter 10*d*, the output impedance of the surface acoustic wave filter 10*d* is able to be higher than about 50Ω, for example.

Comparing FIG. 18A with FIG. 16A, the output impedance of the surface acoustic wave filter 10*d* including five resonators includes a smaller curly portion in the pass band of the surface acoustic wave filter 10*d* compared with the output impedance of the surface acoustic wave filter 10*c* including three resonators. That is, by including a number of resonators as in the surface acoustic wave filter 10*d*, the output impedance of the surface acoustic wave filter 10*d* is able to be increased and stabilized.

Also in the surface acoustic wave filter 10*d*, in order to increase the output impedance to about 70Ω, the main wave length ratio is preferably set at about 1.01 or higher, for example.

In addition, as illustrated in FIG. 18B, if the main wave length ratio is set at about 1.005, about 1.008, and about 1.012, for example, the pass band width of the surface acoustic wave filter 10*d* is expanded as in the above-described surface acoustic wave filter 10*c*. That is, it is discovered that the pass band of the surface acoustic wave filter 10*d* is expanded as the main wave length ratio is increased.

Note that although this preferred embodiment has described the surface acoustic wave filter 10*c* including three resonators and the surface acoustic wave filter 10*d* including five resonators, the number of resonators is not limited to these examples and may be changed.

Fourth Preferred Embodiment

Next, a fourth preferred embodiment of the present invention will be described with reference to FIGS. 19 to 22B. A high-frequency module according to this preferred embodiment is different from the high-frequency module 1 according to the first preferred embodiment in that a main duty in a resonator connected to the output terminal side of the surface acoustic wave filter 10 is adjusted as a method to adjust the output impedance of the surface acoustic wave filter 10.

First, as an example of the configuration of a surface acoustic wave filter according to this preferred embodiment, a longitudinally coupled surface acoustic wave filter 10*e* including three resonators will be described.

Figure 19:
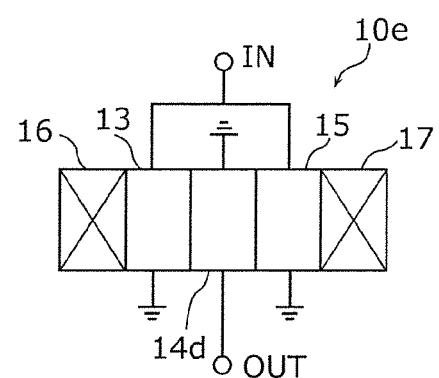
FIG. 19 schematically illustrates the configuration of a surface acoustic wave filter according to a fourth preferred embodiment of the present invention.

FIG. 19 schematically illustrates the configuration of the surface acoustic wave filter 10*e* according to this preferred embodiment.

As illustrated in FIG. 19, the surface acoustic wave filter 10*e* is a longitudinally coupled surface acoustic wave filter. As in the surface acoustic wave filter 10*c* described in the third preferred embodiment, the surface acoustic wave filter 10*e* includes, between the input terminal 11 and the output terminal 12, the resonator 13, a resonator 14*d*, the resonator 15, the reflector 16, and the reflector 17. The resonator 13, the resonator 14*d*, and the resonator 15 are disposed in this order from the reflector 16 side to the reflector 17 side.

In addition, the resonator 13 and the resonator 15 are connected to the input terminal 11 of the surface acoustic wave filter 10*e*. The resonator 14*d* is connected to the output terminal of the surface acoustic wave filter 10*e*. In addition, the resonator 13 and the resonator 15 have the same or substantially the same configurations as those in the surface acoustic wave filter 10 described in the first preferred embodiment. The resonator 14*d* has the same or substantially the same configuration as the resonator 14 described in the first preferred embodiment except for the main duty.

The main duty of the resonator 14*d* is, for example, about 0.64. By changing the main duty of the resonator 14*d* connected to the output terminal 12 of the surface acoustic wave filter 10*e*, the output impedance of the surface acoustic wave filter 10*e* is able to be adjusted, as will be described below.

Figure 20A:
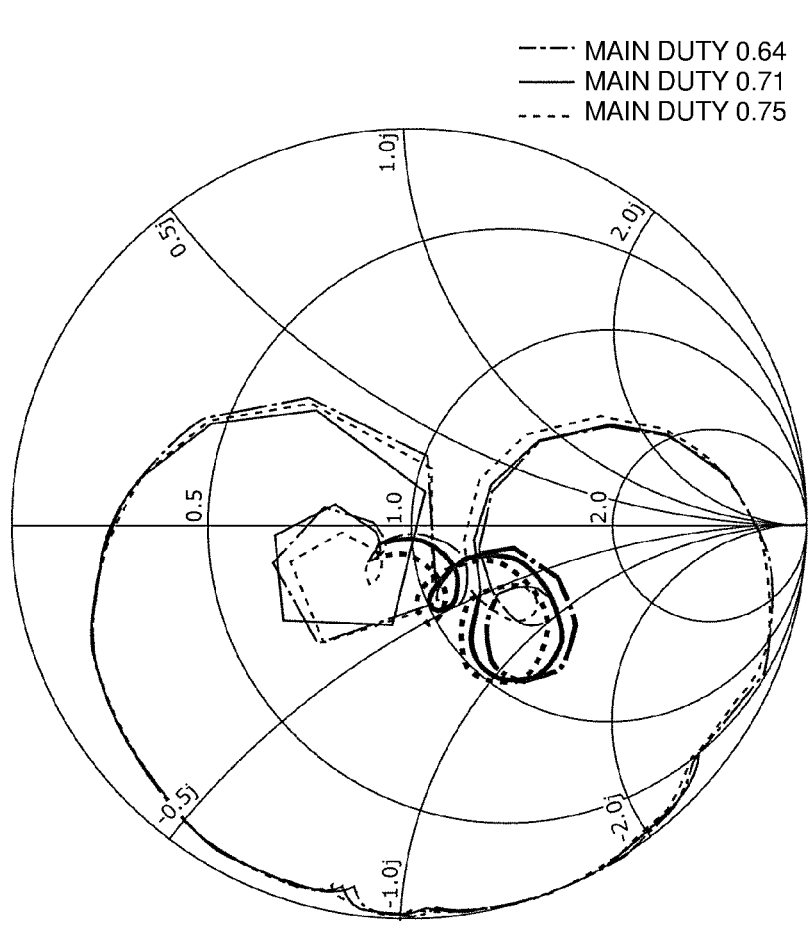
FIG. 20A illustrates reflection characteristics of the output terminal side of the surface acoustic wave filter according to the fourth preferred embodiment of the present invention.
Figure 20B:
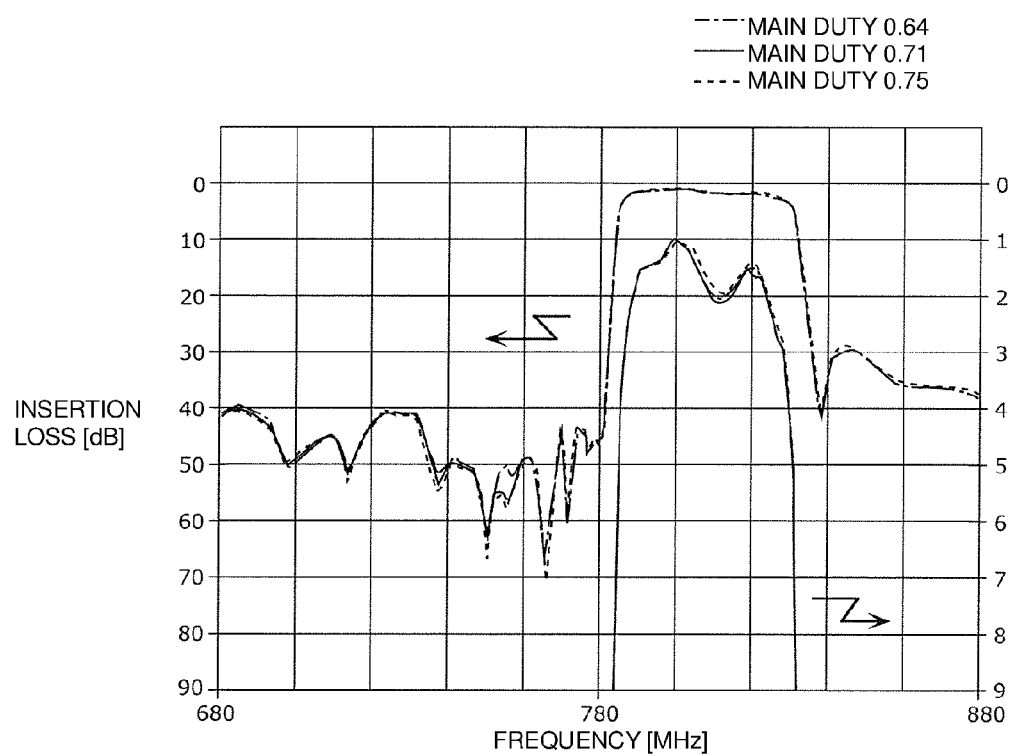
FIG. 20B illustrates bandpass characteristics of the output terminal side of the surface acoustic wave filter according to the fourth preferred embodiment of the present invention.

Now, transmission characteristics of the surface acoustic wave filter 10*e* obtained if the output impedance of the surface acoustic wave filter 10*e* is adjusted by changing the main duty as described above will be described below. Referring to FIGS. 20A and 20B, transmission characteristics of the surface acoustic wave filter 10*e* obtained if the main duty in the surface acoustic wave filter 10e is set at about 0.64, about 0.71, and about 0.75, for example will be described.

FIG. 20A illustrates reflection characteristics of the output terminal side of the surface acoustic wave filter 10e according to this preferred embodiment. FIG. 20B illustrates bandpass characteristics of the output terminal side of the surface acoustic wave filter 10e according to this preferred embodiment. In FIGS. 20A and 20B, dotted chain lines, solid lines, and dashed lines respectively indicate characteristics of the surface acoustic wave filter 10e in which the main duty of the resonator 14d is set at about 0.64, about 0.71, and about 0.75, for example.

When the main duty of the resonator 14d is set at about 0.64, about 0.71, and about 0.75, for example, the output impedance in the pass band of the surface acoustic wave filter 10e shifts left on a Smith chart as the main duty is increased, as illustrated in FIG. 20A. That is, the output impedance of the surface acoustic wave filter 10e is decreased as the main duty is increased.

Accordingly, by decreasing the main duty of the resonator 14d in the surface acoustic wave filter 10e, the output impedance of the surface acoustic wave filter 10e is able to be higher than about 50Ω.

Note that in a case of providing the low-noise amplifier 20 in the subsequent stage of the surface acoustic wave filter 10e as in the high-frequency module 1 illustrated in FIG. 1, the output impedance of the surface acoustic wave filter 10e is preferably about 70Ω, for example. In order to increase the output impedance of the surface acoustic wave filter 10e to about 70Ω, the main duty of the resonator 14d is preferably higher than about 0.55 and lower than about 0.75, for example. When setting the output impedance of the surface acoustic wave filter 10e to about 50Ω, the main duty of the resonator 14d is preferably higher than about 0.4 and lower than about 0.6, for example.

Note that even if the main duty is changed to about 0.64, about 0.71, and about 0.75, for example, as illustrated in FIG. 20B, almost no change is seen in the pass band width of the surface acoustic wave filter 10e. That is, the output impedance of the surface acoustic wave filter 10e is able to be changed by changing the main duty without changing the pass band of the surface acoustic wave filter 10e.

Figure 21:
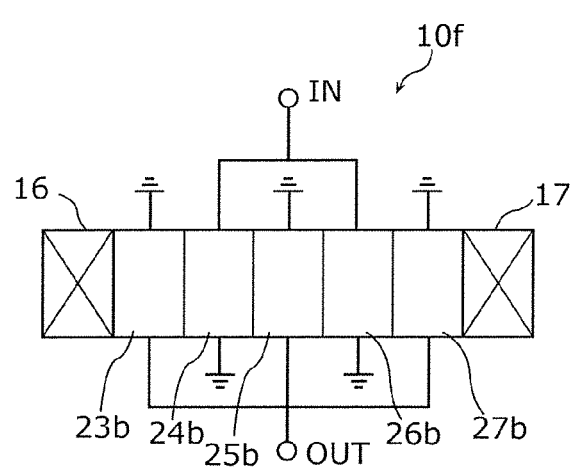
FIG. 21 schematically illustrates another configuration of the surface acoustic wave filter according to the fourth preferred embodiment of the present invention.

FIG. 21 schematically illustrates the configuration of a longitudinally coupled surface acoustic wave filter 10f including five resonators as another configuration of the surface acoustic wave filter according to this preferred embodiment.

As illustrated in FIG. 21, the surface acoustic wave filter 10f includes, between the input terminal 11 and the output terminal 12, a resonator 23b, a resonator 24b, a resonator 25b, a resonator 26b, a resonator 27b, the reflector 16, and the reflector 17. The resonator 23b, the resonator 24b, the resonator 25b, the resonator 26b, and the resonator 27b are disposed in this order from the reflector 16 side to the reflector 17 side.

The resonator 24b and the resonator 26b are connected to the input terminal 11 of the surface acoustic wave filter 10f. The resonator 23b, the resonator 25b, and the resonator 27b are connected to the output terminal 12 of the surface acoustic wave filter 10f. The input impedance at the input terminal 11 of the surface acoustic wave filter 10f and the output impedance at the output terminal 12 thereof are each about 50Ω, for example.

The resonator 24b and the resonator 26b each have the same or substantially the same configuration as the resonator 13 in the surface acoustic wave filter 10e described above.

In addition, the resonator 23b, the resonator 25b, and the resonator 27b each have the same or substantially the same configuration as the resonator 14d in the surface acoustic wave filter 10e described above.

Figure 22A:
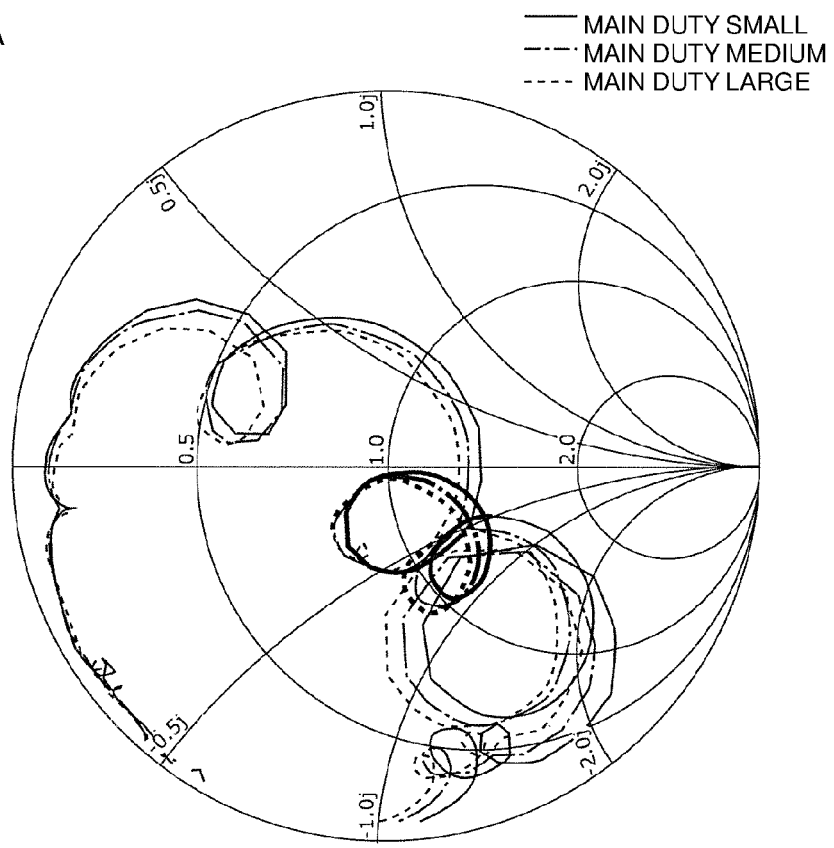
FIG. 22A illustrates reflection characteristics of the output terminal side of the surface acoustic wave filter according to the fourth preferred embodiment of the present invention.
Figure 22B:
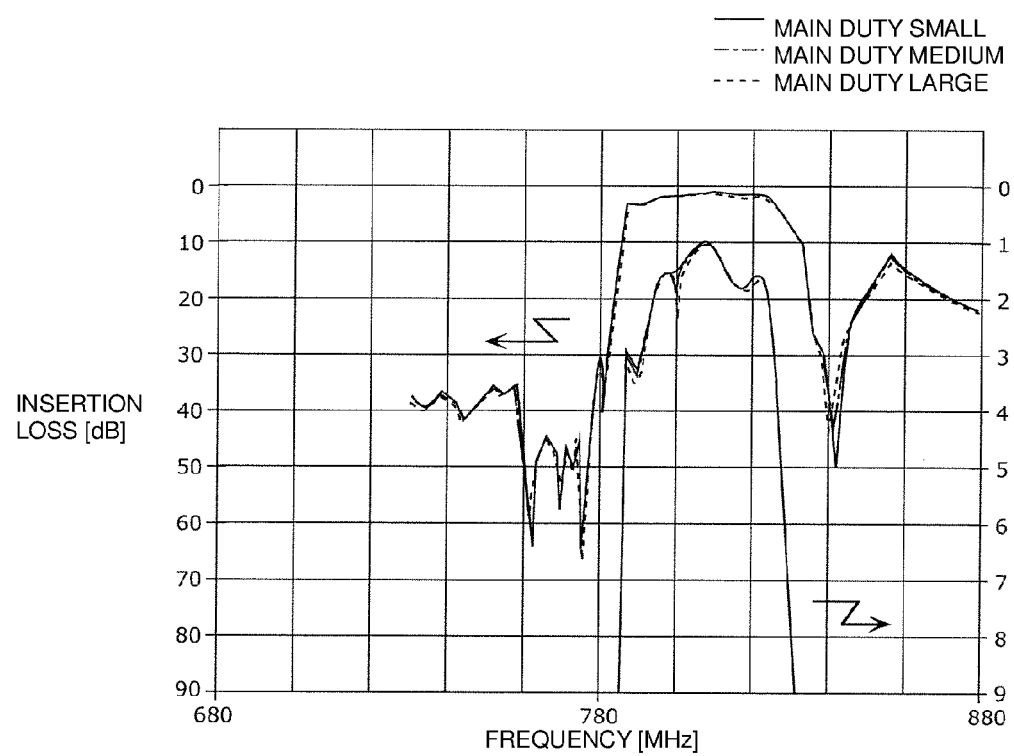
FIG. 22B illustrates bandpass characteristics of the output terminal side of the surface acoustic wave filter according to the fourth preferred embodiment of the present invention.

Now, transmission characteristics of the surface acoustic wave filter 10f obtained if the output impedance of the surface acoustic wave filter 10f is adjusted by changing the main duty as described above will be described below. Referring to FIGS. 22A and 22B, transmission characteristics of the surface acoustic wave filter 10f obtained if the main duty of the surface acoustic wave filter 10f is set to small, medium, and large values will be described. The small main duty of the surface acoustic wave filter 10f refers to a case where the main duty of each of the resonators 23b and 27b is set at about 0.64 and where the main duty of the resonator 25b is set at about 0.67, for example. The medium main duty of the surface acoustic wave filter 10f refers to a case where the main duty of each of the resonators 23b and 27b is set at about 0.70 and where the main duty of the resonator 25b is set at about 0.74, for example. The large main duty of the surface acoustic wave filter 10f refers to a case where the main duty of each of the resonators 23b and 27b is set at about 0.74 and where the main duty of the resonator 25b is set at about 0.77, for example.

FIG. 22A illustrates reflection characteristics of the output terminal side of the surface acoustic wave filter 10f according to this preferred embodiment having another configuration. FIG. 22B illustrates bandpass characteristics of the output terminal side of the surface acoustic wave filter 10f according to this preferred embodiment having another configuration. In FIGS. 22A and 22B, solid lines, dotted chain lines, and dashed lines respectively indicate characteristics of the surface acoustic wave filter 10f in which the main duty is set to the above-described small, medium, and large values.

As in a case of the above-described surface acoustic wave filter 10e, when the main duty of each of the resonators 23b, 25b, and 27b connected to the output terminal 12 is set to the above-described small, medium, and large values, the output impedance in the pass band of the surface acoustic wave filter 10f shifts left on a Smith chart as the main duty of each of the resonators 23b, 25b, and 27b is increased, as illustrated in FIG. 22A. That is, the output impedance of the surface acoustic wave filter 10f is decreased as the main duty of each of the resonators 23b, 25b, and 27b is increased.

Accordingly, by decreasing the main duty of each of the resonators 23b, 25b, and 27b in the surface acoustic wave filter 10f, the output impedance of the surface acoustic wave filter 10f is able to be higher than about 50Ω, for example.

Note that in a case of providing the low-noise amplifier 20 in the subsequent stage of the surface acoustic wave filter 10f as in the high-frequency module 1 illustrated in FIG. 1, the output impedance of the surface acoustic wave filter 10f is preferably about 70Ω, for example. In order to increase the output impedance of the surface acoustic wave filter 10f to about 70Ω, the main duty of each of the resonators 23b, 25b, and 27b is preferably higher than about 0.55 and lower than about 0.75, for example.

Note that even if the main duty of each of the resonators 23b, 25b, and 27b is changed to the above-described small, medium, and large values, as illustrated in FIG. 22B, almost no change is seen in the pass band width of the surface acoustic wave filter 10f. That is, the output impedance of the surface acoustic wave filter 10f is able to be changed by changing the main duty of each of the resonators 23b, 25b, and 27b without changing the pass band of the surface acoustic wave filter 10f.

Note that the values of the main duty are not limited to the above values and may be changed as appropriate.

Fifth Preferred Embodiment

Next, a fifth preferred embodiment of the present invention will be described with reference to FIGS. 23 to 25B. A high-frequency module according to this preferred embodiment is different from the high-frequency module 1 according to the first preferred embodiment in that, in a surface acoustic wave filter 10g, an interlayer insulating film 40 is disposed between the substrate and a wiring between an output terminal and a resonator connected to the output terminal.

Figure 23:
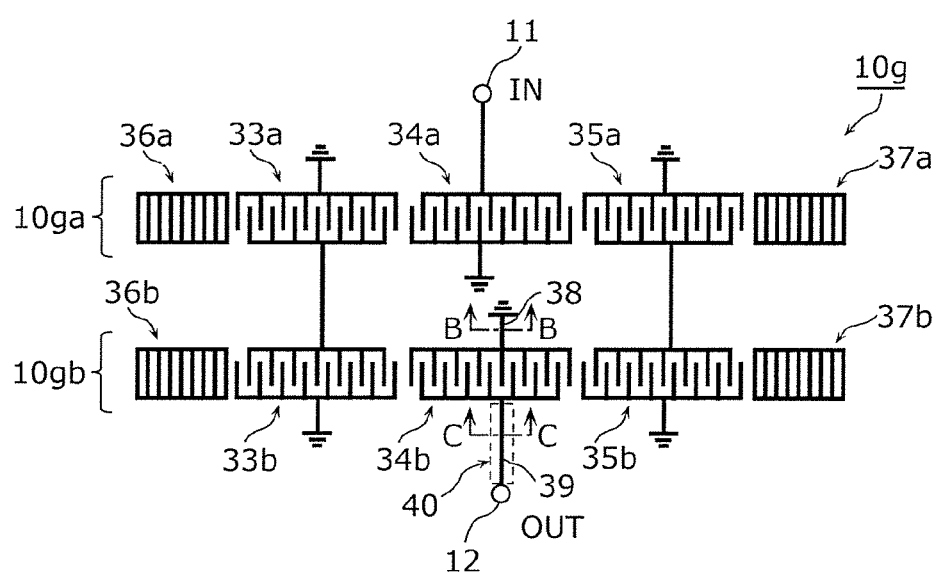
FIG. 23 schematically illustrates the configuration of a surface acoustic wave filter according to a fifth preferred embodiment of the present invention.

FIG. 23 schematically illustrates the configuration of the surface acoustic wave filter 10g according to this preferred embodiment. As illustrated in FIG. 23, the surface acoustic wave filter 10g according to this preferred embodiment has a configuration in which two longitudinally coupled surface acoustic wave resonators, a first surface acoustic wave resonator 10ga and a second surface acoustic wave resonator 10gb, are connected in series to each other.

As illustrated in FIG. 23, the first surface acoustic wave resonator 10ga includes a resonator 33a, a resonator 34a, a resonator 35a, a reflector 36a, and a reflector 37a. The resonator 33a, the resonator 34a, and the resonator 35a are disposed in this order from the reflector 36a side to the reflector 37a side. The resonator 33a, the resonator 34a, the resonator 35a, the reflector 36a, and the reflector 37a have the same or substantially the same configurations as the resonator 13, the resonator 14, the resonator 15, the reflector 16, and the reflector 17 of the surface acoustic wave filter 10 described in the first preferred embodiment.

Similarly, as illustrated in FIG. 23, the second surface acoustic wave resonators 10gb includes a resonator 33b, a resonator 34b, a resonator 35b, a reflector 36b, and a reflector 37b. The resonator 33b, the resonator 34b, and the resonator 35b are disposed in this order from the reflector 36b side to the reflector 37b side. The resonator 33b, the resonator 34b, the resonator 35b, the reflector 36b and the reflector 37b have the same or substantially the same configurations as the resonator 13, the resonator 14, the resonator 15, the reflector 16, and the reflector 17 of the surface acoustic wave filter 10 described in the first preferred embodiment.

In the resonator 34a, one of a pair of IDT electrodes is connected to the input terminal 11 of the surface acoustic wave filter 10g. In the resonator 34b, one of a pair of IDT electrodes is connected to the output terminal 12 of the surface acoustic wave filter 10g. In addition, the other of the pair of IDT electrodes in the resonator 34a and the other of the pair of IDT electrodes in the resonator 34b are each connected to the ground.

In the resonator 33a, one of a pair of IDT electrodes is connected to one of a pair of IDT electrodes in the resonator 33b. In addition, the other of the pair of IDT electrodes in the resonator 33a and the other of the pair of IDT electrodes in the resonator 33b are each connected to the ground.

Similarly, in the resonator 35a, one of a pair of IDT electrodes is connected to one of a pair of IDT electrodes in the resonator 35b. In addition, the other of the pair of IDT electrodes in the resonator 35a and the other of the pair of IDT electrodes in the resonator 35b are each connected to the ground.

With this configuration, the surface acoustic wave filter 10g has a configuration in which, between the input terminal 11 and the output terminal 12, the longitudinally coupled first and second surface acoustic wave resonators 10ga and 10gb are directly connected to each other. In some cases where the surface acoustic wave filter 10g includes a multiple-stage surface acoustic wave resonators as in this case, three-dimensional wiring by using an interlayer insulating film may be necessary in order to provide a ground electrode for the surface acoustic wave resonators. That is, an interlayer insulating film may be provided on one lead wiring, and another lead wiring may be provided on the interlayer insulating film.

In the surface acoustic wave filter 10g according to this preferred embodiment, the interlayer insulating film 40 is provided between a piezoelectric substrate 42 and a wiring 39, not at a position where such three-dimensional wiring is necessary, but at a position where three-dimensional wiring is unnecessary, which is the position of the wiring 39 that connects the one of the IDT electrodes of the resonator 34b to the output terminal 12.

Figure 24A:
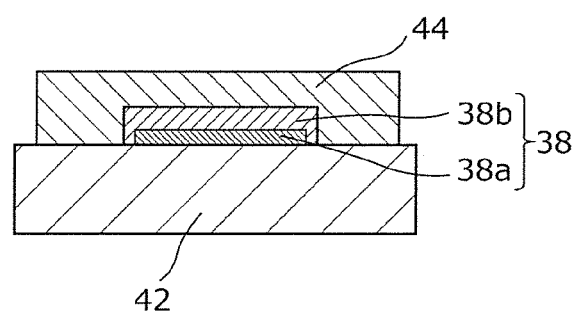
FIG. 24A is a sectional view of the configuration of the surface acoustic wave filter illustrated in FIG. 23 taken along line B-B.
Figure 24B:
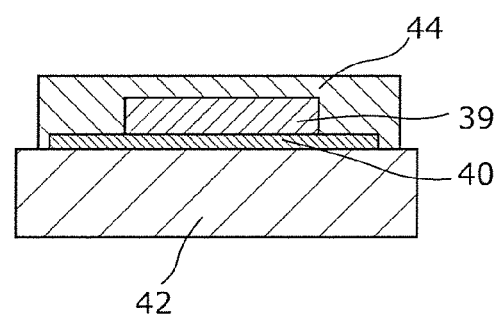
FIG. 24B is a sectional view of the configuration of the surface acoustic wave filter illustrated in FIG. 23 taken along line C-C.

FIG. 24A is a sectional view of the configuration of the surface acoustic wave filter illustrated in FIG. 23 taken along line B-B. FIG. 24B is a sectional view of the configuration of the surface acoustic wave filter illustrated in FIG. 23 taken along line C-C.

As in the surface acoustic wave filter 10 described in the first preferred embodiment, the surface acoustic wave filter 10g is provided on the piezoelectric substrate 42, as illustrated in FIGS. 24A and 24B. In addition, the wiring connected to the IDT electrodes of the resonators has the same or substantially the same configuration as the IDT electrodes.

Specifically, a wiring 38 that connects the other of the IDT electrodes of the resonator 34b to the ground in FIG. 23 includes a first electrode layer 38a provided on the piezoelectric substrate 42 and a second electrode layer 38b provided on the first electrode layer 38a, as illustrated in FIG. 24A.

The first electrode layer 38a is integral with the main electrode layer of the IDT electrodes and is formed of, for example, Pt, Cu, Au, Ag, Ta, W, or the like. Note that the first electrode layer 38a may include a close-contact layer (see (b) of FIG. 3) on the piezoelectric substrate 42 side. The first electrode layer 38a preferably has a thickness on the submicron order, for example, about 0.2 µm. The second electrode layer 38b is formed of, for example, Pt, Cu, Au, Ag, Ta, W, or the like. The second electrode layer 38b preferably has a thickness on the micron order, for example, about 2 µm.

In addition, a protective layer 44 covers the second electrode layer 38b. The protective layer 44 is formed of, for example, SiO₂ or the like. The protective layer 44 has a thickness of a few tens of nanometers, for example, about 30 nm.

In FIG. 23, the wiring 39 that connects the one of the IDT electrodes of the resonator 34b to the output terminal 12 is provided on the interlayer insulating film 40 that is located on the piezoelectric substrate 42, as illustrated in FIG. 24B. That is, compared with the above-described wiring 38, for the wiring 39, the interlayer insulating film 40 is provided instead of the first electrode layer 38a.

The interlayer insulating film 40 is preferably made of, for example, polyimide or the like. The interlayer insulating film 40 has a thickness on the micron order, for example, 3 µm. In addition, the wiring 39 is preferably made of the same material as the second electrode layer 38b illustrated in FIG. 24A. The wiring 39 is formed of, for example, Pt, Cu, Au, Ag, Ta, W, or the like. Note that, as illustrated in FIG. 24B, the protective layer 44 covers the interlayer insulating film 40 and the wiring 39 on the piezoelectric substrate 42.

By providing the interlayer insulating film 40 between the piezoelectric substrate 42 and the wiring 39 connected to the output terminal 12, compared with the configuration of the wiring 38 where the interlayer insulating film 40 is not provided, the capacitive coupling between the piezoelectric substrate 42 and the wiring 39 is able to be reduced. Thus, it is possible to adjust the output impedance of the surface acoustic wave filter 10g toward an inductive impedance side.

In addition, as illustrated in FIG. 24B, by increasing the area of the interlayer insulating film 40 to be larger than the area of the wiring 39, the capacitive coupling between the piezoelectric substrate 42 and the wiring 39 is able to be further reduced. Thus, the output impedance of the surface acoustic wave filter 10g is able to be adjusted farther toward the inductive impedance side.

Now, transmission characteristics of the surface acoustic wave filter 10g including and not including the interlayer insulating film 40 will be described below.

Figure 25A:
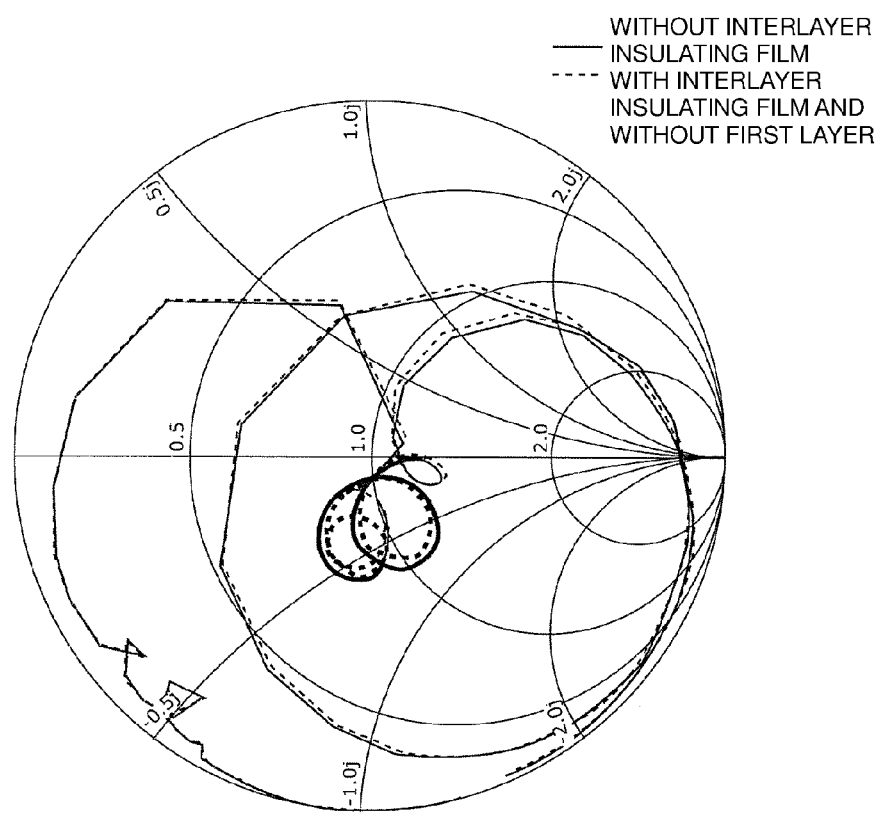
FIG. 25A illustrates reflection characteristics of the output terminal side of the surface acoustic wave filter according to the fifth preferred embodiment of the present invention having another configuration.
Figure 25B:
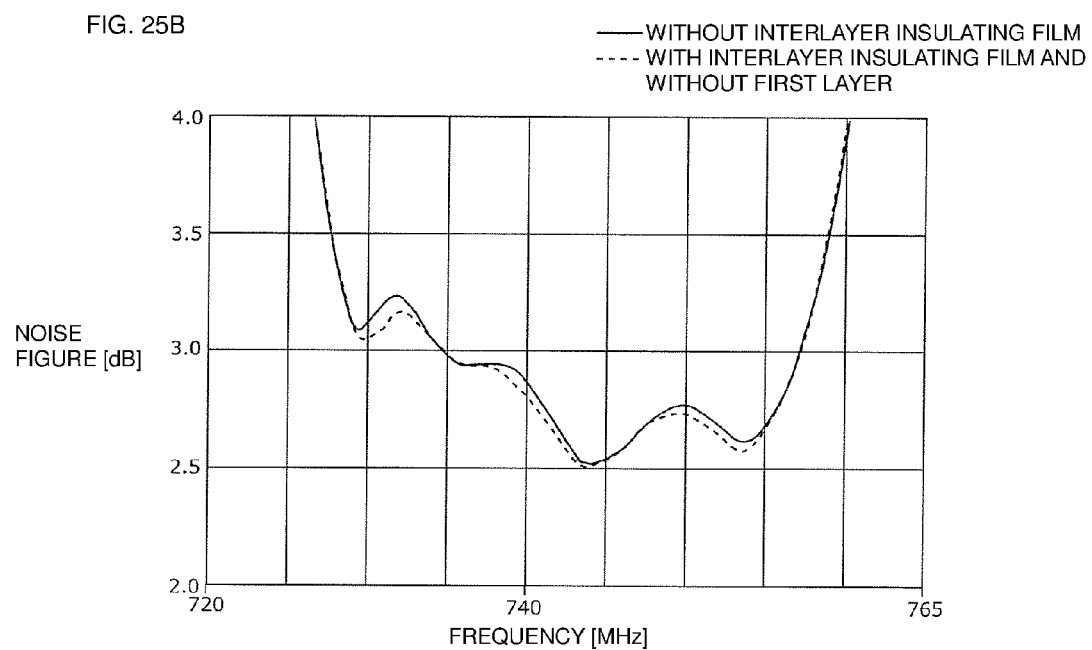
FIG. 25B illustrates noise characteristics of the output terminal side of the surface acoustic wave filter according to the fifth preferred embodiment of the present invention.

FIG. 25A illustrates reflection characteristics of the output terminal side of the surface acoustic wave filter 10g according to this preferred embodiment having another configuration. FIG. 25B illustrates noise characteristics obtained after the low-noise amplifier 20 is connected to the surface acoustic wave filter 10g according to this preferred embodiment. In FIGS. 25A and 25B, solid lines indicate characteristics of the surface acoustic wave filter 10g not including the interlayer insulating film 40 between the piezoelectric substrate 42 and the wiring 39 connected to the output terminal 12, and dashed lines indicate characteristics of the surface acoustic wave filter 10g including the interlayer insulating film 40 instead of the first electrode layer 38a.

As illustrated in FIG. 25A, it is discovered that, compared with the output impedance in the pass band of the surface acoustic wave filter 10g not including the interlayer insulating film 40, the output impedance in the pass band of the surface acoustic wave filter 10g including the interlayer insulating film 40 instead of the first electrode layer 38a shifts toward the upper right on a Smith chart, that is, toward the inductive impedance side. Accordingly, by providing the interlayer insulating film 40, the capacitive coupling between the piezoelectric substrate 42 and the wiring 39 is able to be reduced.

In addition, in the high-frequency module 1 in which the low-noise amplifier 20 is connected to the output terminal side of the surface acoustic wave filter 10g, as illustrated in FIG. 25B, it is discovered that, by providing the interlayer insulating film 40 between the piezoelectric substrate 42 and the wiring 39, the noise figure is reduced compared with the case where the interlayer insulating film 40 is not provided. Accordingly, by providing the interlayer insulating film 40 between the piezoelectric substrate 42 and the wiring 39 in the surface acoustic wave filter 10g, the noise characteristics of the entire high-frequency module 1 are improved.

Note that, in the above-described surface acoustic wave filter 10g, compared with the wiring 38, although the interlayer insulating film 40 is provided instead of the first electrode layer 38a for the wiring 39 connected to the output terminal 12, the wiring 39 may have a configuration including both a first electrode layer and a second electrode layer.

Figure 26:
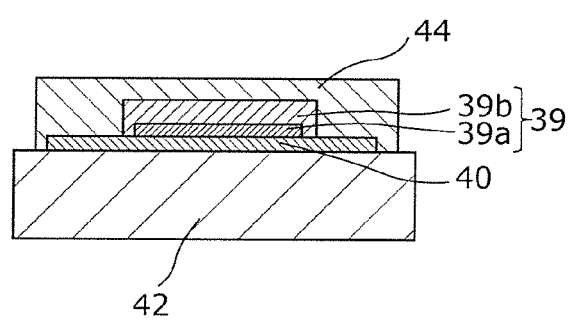
FIG. 26 is a sectional view of another configuration of the surface acoustic wave filter illustrated in FIG. 23 taken along line C-C.

FIG. 26 is a sectional view of another configuration of the surface acoustic wave filter illustrated in FIG. 23 taken along line C-C. As in the wiring 38 illustrated in FIG. 24A, the wiring 39 illustrated in FIG. 26 includes a first electrode layer 39a and a second electrode layer 39b. The first electrode layer 39a and the second electrode layer 39b have the same or substantially the same configurations as the first electrode layer 38a and the second electrode layer 38b. The interlayer insulating film 40 is provided between the piezoelectric substrate 42 and the wiring 39. The protective layer 44 covers the interlayer insulating film 40 and the wiring 39 on the piezoelectric substrate 42.

In a case of providing the interlayer insulating film 40 between the piezoelectric substrate 42 and the wiring 39, the change in the output impedance of the surface acoustic wave filter 10g is larger if the interlayer insulating film 40 is provided instead of the first electrode layer 39a than if the interlayer insulating film 40 is provided with the first electrode layer 39a left. Accordingly, it is preferable to provide the interlayer insulating film 40 instead of the first electrode layer 39a if it is desired that the change in the output impedance of the surface acoustic wave filter 10g be adjusted with a large amount, and it is preferable to provide the interlayer insulating film 40 with the first electrode layer 39a left if it is desired that the change in the output impedance of the surface acoustic wave filter 10g be adjusted with a small amount.

Note that although the surface acoustic wave filter 10g according to this preferred embodiment has the configuration including the first surface acoustic wave resonator 10ga and the second surface acoustic wave resonators 10gb, the surface acoustic wave filter 10g is not limited to this configuration and may include a single-stage longitudinally coupled surface acoustic wave resonator or a multiple-stage longitudinally coupled surface acoustic wave resonators.

Other Preferred Embodiments

Note that the present invention is not limited to the configurations described in the above preferred embodiments and may be modified as appropriate as in the modification examples below.

For example, the above-described preferred embodiments have described, as the electrode parameter to adjust the output impedance of the surface acoustic wave filter, the number of withdrawal electrodes in a resonator connected to the output terminal, the number of divisions in the intersecting width direction of a resonator, the main wave length of resonators, and the main duty of a resonator; however, another parameter may be used as the electrode parameter. For example, the pitch of electrode fingers of a resonator, the number of pairs of the electrode fingers, or the like may be the electrode parameter. In addition, the values for the electrode parameter are not limited to the values in the above-described preferred embodiments and may be changed as appropriate.

The number of resonators included in the surface acoustic wave filter is not limited to three or five and may be changed.

The materials for the substrate, electrodes, protective layer, and the like for the resonators are not limited to the above-described materials and may be changed as appropriate. In addition, the size, pitch, and number of pairs of the electrode fingers in each resonator may be changed as long as the above-described conditions are satisfied.

In addition, the surface acoustic wave filter preferably is directly connected to the low-noise amplifier in the above-described preferred embodiments; however, a matching element may further be provided between the surface acoustic wave filter and the low-noise amplifier. Note that it is possible to adjust the output impedance of the surface acoustic wave filter according to the above-described preferred embodiments, and accordingly, even if the surface acoustic wave filter is directly connected to the low-noise amplifier as described above without providing a matching element, the loss and noise can be reduced.

The present invention includes other preferred embodiments to be implemented by making various modifications conceivable by a person skilled in the art to the above-described preferred embodiments and modification examples and includes preferred embodiments to be implemented by combining any of the components and functions in the above-described preferred embodiments and modification examples without departing from the spirit of the present invention.

Preferred embodiments of the present invention are applicable to a high-frequency module, duplexer, multiplexer, reception apparatus, and the like using a surface acoustic wave filter connected to a low-noise amplifier.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
a longitudinally coupled surface acoustic wave filter including a plurality of resonators; and
a low-noise amplifier that is connected to the surface acoustic wave filter and that amplifies a high-frequency signal that has passed through the surface acoustic wave filter; wherein
an input impedance of the surface acoustic wave filter connected to the low-noise amplifier differs from an output impedance thereof; and
on a Smith chart, the output impedance in a pass band of the surface acoustic wave filter is present in a region between a first output impedance and a second output impedance, the first output impedance being the output impedance of the surface acoustic wave filter where a gain of the low-noise amplifier is maximum, the second output impedance being the output impedance of the surface acoustic wave filter where a noise figure of the low-noise amplifier is minimum.

2. The high-frequency module according to claim 1, wherein the surface acoustic wave filter includes an electrode parameter to adjust the output impedance in the pass band of the surface acoustic wave filter to be in the region on the Smith chart.

3. The high-frequency module according to claim 2, wherein
an interdigital transducer (IDT) electrode of at least one of the resonators that is connected to an output terminal of the surface acoustic wave filter includes a withdrawal electrode; and
the electrode parameter is a number of the withdrawal electrodes.

4. The high-frequency module according to claim 3, wherein the withdrawal electrode is provided in an approximately central region of the resonator.

5. The high-frequency module according to claim 4, wherein the withdrawal electrode is provided in an approximately 46% area portion in the approximately central region of the resonator.

6. The high-frequency module according to claim 2, wherein
an interdigital transducer (IDT) electrode of one of the resonators that is connected to an output terminal of the surface acoustic wave filter is divided in an intersecting width direction; and
the electrode parameter is a number of divisions of the IDT electrode in the intersecting width direction.

7. The high-frequency module according to claim 2, wherein
the electrode parameter includes a first main wave length and a second main wavelength, the first main wave length being an average main wave length of one or more of the resonators that are connected to an input terminal of the surface acoustic wave filter, the second main wave length being an average main wave length of one or more of the resonators that are connected to an output terminal of the surface acoustic wave filter; and
the first main wave length differs from the second main wave length.

8. The high-frequency module according to claim 7, wherein
the electrode parameter is a main wave length ratio that is a ratio of a second main wave length to a first main wave length, the first main wave length being an average value of a main wave length of at least one of the resonators that is connected to an input terminal of the surface acoustic wave filter, the second main wave length being an average value of a main wave length of at least one of the resonators that is connected to an output terminal of the surface acoustic wave filter.

9. The high-frequency module according to claim 8, wherein the main wave length ratio is higher than or equal to about 1.01.

10. The high-frequency module according to claim 2, wherein the electrode parameter is a main duty of one of the resonators that is connected to an output terminal of the surface acoustic wave filter.

11. The high-frequency module according to claim 10, wherein the main duty is higher than about 0.55 and lower than about 0.75.

12. The high-frequency module according to claim 1, wherein, in the surface acoustic wave filter, a wiring between an interdigital transducer (IDT) electrode of one of the resonators that is connected to an output terminal of the surface acoustic wave filter and the output terminal of the surface acoustic wave filter is provided on an interlayer insulating film located on a substrate.

13. The high-frequency module according to claim 12, wherein
the IDT electrode of one of the resonator that is connected to an output terminal of the surface acoustic wave filter includes a first electrode layer and a second electrode layer, the first electrode layer being provided on a substrate, the second electrode layer being provided on the first electrode layer; and
the wiring at a position where the interlayer insulating film is disposed includes the first electrode layer and the second electrode layer.

14. The high-frequency module according to claim 12, wherein
the IDT electrode of one of the resonators that is connected to an output terminal of in the surface acoustic wave filter includes a first electrode layer and a second electrode layer, the first electrode layer being provided on a substrate, the second electrode layer being provided on the first electrode layer; and the wiring at a position where the interlayer insulating film is disposed includes the second electrode layer being provided on the interlayer insulating film.

15. The high-frequency module according to claim 2, wherein an interdigital transducer (IDT) electrode of at least one of the resonators that is connected to an output terminal of the surface acoustic wave filter includes a withdrawal electrode; and the electrode parameter is a pitch of electrode fingers of the IDT electrode.

16. The high-frequency module according to claim 2, wherein an interdigital transducer (IDT) electrode of at least one of the resonators that is connected to an output terminal of the surface acoustic wave filter includes a withdrawal electrode; and the electrode parameter is a pitch of electrode fingers of the IDT electrode.

17. The high-frequency module according to claim 1, wherein a number of the plurality of resonators is three.

18. The high-frequency module according to claim 1, wherein a number of the plurality of resonators is five.

19. The high-frequency module according to claim 1, wherein the surface acoustic wave filter is directly connected to the low-noise amplifier.

20. The high-frequency module according to claim 1, further comprising a matching element provided between the surface acoustic wave filter and the low-noise amplifier.

* * * * *